US008446445B2

(12) United States Patent  (10) Patent No.:  US 8,446,445 B2
Ebisawa et al.  (45) Date of Patent:  May 21, 2013

(54) EXPOSURE DEVICE, IMAGE FORMING APPARATUS AND METHOD FOR OPERATING EXPOSURE DEVICE

(75) Inventors: Isao Ebisawa, Hamura (JP); Yoshiyuki Matsuoka, Tokorozawa (JP); Kenji Kobayashi, Hino (JP); Tomoyuki Shirasaki, Higashiyamato (JP); Tsuyoshi Ozaki, Fuchu (JP)

(73) Assignee: Casio Computer Co., Ltd., Tokyo (JP)

( * ) Notice: Subject to any disclaimer, the term of this patent is extended or adjusted under 35 U.S.C. 154(b) by 1636 days.

(21) Appl. No.: 11/904,638

(22) Filed: Sep. 27, 2007

(65) Prior Publication Data

US 2008/0074704 A1  Mar. 27, 2008

(30) Foreign Application Priority Data

Sep. 27, 2006 (JP) ................................. 2006-263128
Mar. 29, 2007 (JP) ................................. 2007-087376

(51) Int. Cl.
*B41J 2/435* (2006.01)
*B41J 2/45* (2006.01)
*B41J 2/47* (2006.01)

(52) U.S. Cl.
USPC ............ 347/237; 347/247; 347/238; 347/225

(58) Field of Classification Search
USPC ............ 347/225, 237, 247, 130, 238; 257/59, 257/918
See application file for complete search history.

(56) References Cited

U.S. PATENT DOCUMENTS

| | | | | |
|---|---|---|---|---|
| 2002/0088984 | A1* | 7/2002 | Toda et al. ...................... | 257/99 |
| 2005/0094691 | A1* | 5/2005 | Yamazaki et al. ......... | 372/38.03 |
| 2005/0212408 | A1 | 9/2005 | Yoshida et al. | |
| 2006/0027811 | A1* | 2/2006 | Jiroku ............................. | 257/72 |
| 2006/0055631 | A1 | 3/2006 | Yoshida | |

FOREIGN PATENT DOCUMENTS

| | | |
|---|---|---|
| JP | 7-256925 A | 10/1995 |
| JP | 2000-218854 A | 8/2000 |
| JP | 2002-079707 A | 3/2002 |
| JP | 2002-175046 A | 6/2002 |

(Continued)

OTHER PUBLICATIONS

Japanese Office Action dated Jan. 30, 2009 and English translation thereof issued in a counterpart Japanese Application No. 2007-087376.

(Continued)

*Primary Examiner* — Stephen Meier
*Assistant Examiner* — Sarah Al Hashimi
(74) *Attorney, Agent, or Firm* — Holtz, Holtz, Goodman & Chick, P.C.

(57) ABSTRACT

An exposure device for exposing a photoreceptor, includes: data electrodes disposed for each of a plurality of columns parallel to a moving direction of the photoreceptor; selected electrodes disposed for each of a plurality of rows perpendicular to each of the data electrodes; light emitting element arrays including light emitting elements disposed near intersection points between the data electrodes and the selected electrodes in intersections between the data electrodes and the selected electrodes, the light emitting elements being linearly arrayed; a driving signal output circuit for generating a driving signal based on an image signal to supply the driving signal to the light emitting element arrays; and a column selection unit for switching the light emitting element arrays to be selected based on a lighting situation of each of the light emitting elements of each of the light emitting element arrays.

23 Claims, 27 Drawing Sheets

FOREIGN PATENT DOCUMENTS

| | | |
|---|---|---|
| JP | 2003-001864 A | 1/2003 |
| JP | 2003-341140 A | 12/2003 |
| JP | 2003-341141 A | 12/2003 |
| JP | 2004-167723 A | 6/2004 |
| JP | 2005-096088 A | 4/2005 |
| JP | 2005-096259 A | 4/2005 |
| JP | 2005-096260 A | 4/2005 |
| JP | 2005-231171 A | 9/2005 |
| JP | 2005-283781 A | 10/2005 |
| JP | 2005-329636 A | 12/2005 |
| JP | 2005-329659 A | 12/2005 |
| JP | 2006-071686 A | 3/2006 |
| JP | 2006-088344 A | 4/2006 |

OTHER PUBLICATIONS

Japanese Office Action dated Jun. 19, 2009 and English translation thereof issued in a counterpart Japanese Application No. 2007-087376.

Japanese Office Action dated Apr. 17, 2012 (and English translation thereof) in counterpart Japanese Application No. 2006-263128.

Japanese Office Action dated Oct. 9, 2012 (and English translation thereof) in counterpart Japanese Application No. 2006-263128.

* cited by examiner

EXPOSURE DEVICE, IMAGE FORMING APPARATUS AND METHOD FOR OPERATING EXPOSURE DEVICE

BACKGROUND OF THE INVENTION

1. Field of the Invention

The present invention relates to an image forming apparatus for forming an image in a recording medium, an exposure device for exposing a photoreceptor of the image forming apparatus, and a method for operating the exposure device.

2. Description of the Related Art

A page printer executes exposure along a bus of a rotated photosensitive drum by an exposure device to form an electrostatic latent image in a peripheral surface of the photosensitive drum, adheres toner to the photosensitive drum to make the electrostatic latent image visible, and transfers an image of the photosensitive drum to paper.

In a general exposure device, a laser beam is scanned along a line by a rotated polygon lens in a dot sequential manner to form a latent image in a photosensitive drum. An exposure device in which organic electroluminescent (EL) elements are arrayed in a row is also available. The organic EL element has problems in life, emission intensity, and exposure time as compared with the other light emitting elements such as a LED. In other words, when emission intensity of the organic EL element is increased, exposure time is shortened to enable fast image forming. However, a life of the organic EL element is shortened. When emission intensity of the organic EL element is reduced, the life of the organic EL element is prolonged. However, exposure time is made longer to extend time necessary for the image forming.

Therefore, an exposure device that includes organic EL elements arrayed in a plurality of columns, and executes multiple exposure by the plurality of organic EL elements to form a pixel of one dot has been proposed (Japanese Patent Application Laid-Open Nos. 2003-341140 and 2003-341141). In other words, an image of one lines is exposed in paper by the organic EL element of a certain column, by timing when the paper is moved and the line reaches a next column, and an image of one line is exposed again to be superposed in the paper by the organic EL element of the next column, thereby forming a pixel of one dot through multiple exposure.

However, the timing when one line of the paper reaches the organic EL element of a next column from the organic EL element of a certain column and timing when the organic EL element of the next column emits a light must be synchronized with each other, and this synchronization is very difficult. Especially, a complex circuit such as a shift register for transmitting light emission data from a certain column to a next column must be mounted in the exposure device. Thus, a structure of the exposure device is complex. Further, there is a problem that the exposure device is expensive.

SUMMARY OF THE INVENTION

The present invention has been developed to solve the aforementioned problems. An object of the invention is to provide an exposure device and the like having a simple structure at a low price.

In order to achieve the object, an exposure device for exposing a photoreceptor, comprises:

a plurality of data electrodes disposed for each of a plurality of columns parallel to a moving direction of the photoreceptor;

a plurality of selected electrodes disposed for each of a plurality of rows perpendicular to each of the data electrodes;

a plurality of light emitting element arrays which include a plurality of light emitting elements disposed near intersection points between the data electrodes and the selected electrodes in intersections between the data electrodes and the selected electrodes, the plurality of light emitting elements being linearly arrayed;

a driving signal output circuit for generating a driving signal based on an image signal to supply the driving signal to the light emitting element arrays; and a column selection unit for switching the light emitting element arrays to be selected based on a lighting situation of each of the light emitting elements of each of the light emitting element arrays.

Preferably, the driving signal output circuit time-sequentially supplies the driving signals corresponding to each of the predetermined number of light emitting elements of the light emitting element array, and the exposure device further comprises:

a dividing circuit for dividing each driving signal so as to correspond to the predetermined number of light emitting elements of the light emitting element array; and a division control circuit for controlling application of the driving signals to each of the predetermined number of light emitting elements according to time-sequential timing of the driving signal.

In order to achieve the object, an exposure device for exposing a photoreceptor, comprises:

a plurality of data electrodes disposed for each of a plurality of columns parallel to a moving direction of the photoreceptor;

a plurality of selected electrodes disposed for each of a plurality of rows perpendicular to each of the data electrodes;

a plurality of light emitting element arrays which include a plurality of light emitting elements disposed near intersection points between the data electrodes and the selected electrodes in intersections between the data electrodes and the selected electrodes, the plurality of light emitting elements being linearly arrayed; and a column selection unit for designating a selected electrode of a certain predetermined column among the plurality of selected electrodes and setting selected electrodes of the other columns to undesignated selected electrodes during image forming executed on a recording medium, for executing the image forming on the recording medium only by a light emitting element of a column connected to the designated selected electrode, and for switching the light emitting element arrays to be selected based on a lighting situation of each of the light emitting elements of each of the light emitting element arrays.

Preferably, the column selection unit switches the designating of the selected electrode to the selected electrode of another column every time the image forming executed on one recording medium is ended.

Preferably, the column selection unit switches the designating of the selected electrode to the selected electrode of another column every time the image forming executed on a plurality of recording media is ended.

Preferably, the column selection unit switches the designating of the selected electrode to the selected electrode of another column every time the image forming executed on a predetermined number of recording media within a predetermined period is ended.

Preferably, the column selection unit switches the designating of the selected electrode to the selected electrode of another column when a light emitting element corresponding to the designated selected electrode reaches a predetermined temperature.

Preferably, the column selection unit switches the designating of the selected electrode to the selected electrode of another column after the image forming executed on the recording medium is ended, when timing at which the light emitting element superposed in the designated selected electrode reaches the predetermined temperature is during the image forming executed on the recording medium.

Preferably, the column selection unit switches the designating of the selected electrode to the selected electrode of another column when an applied current flowing through the light emitting element is reduced to a predetermined value due to time degradation of the light emitting element.

Preferably, the column selection unit switches the designating of the selected electrode to the selected electrode of another column after the image forming executed on the recording medium is ended, when timing at which a current applied to the plurality of data electrodes is reduced to a predetermined value is during the image forming executed on the recording medium.

Preferably, the column selection unit switches the designating of the selected electrode to the selected electrode of another column when a voltage applied to the light emitting element increases to a predetermined value due to time degradation of the light emitting element.

Preferably, the column selection unit switches the designating of the selected electrode to the selected electrode of another column after the image forming executed on the recording medium is ended, when timing at which the voltage applied to the plurality of data electrodes increases to a predetermined value is during the image forming executed on the recording medium.

Preferably, the column selection unit switches the designating of the selected electrode to the selected electrode of another column every time an image forming apparatus is started up.

Preferably, the lighting circuit includes a plurality of transistors connected to the data electrodes.

In order to achieve the object, an image forming apparatus for forming an image on a recording medium, comprises:
a photosensitive drum including a photoreceptor; and
an exposure device which includes a plurality of data electrodes disposed for each of a plurality of columns parallel to a moving direction of the photoreceptor by rotation of the photosensitive drum; a plurality of selected electrodes disposed for each of a plurality of rows perpendicular to each of the data electrodes; a plurality of light emitting element arrays having a plurality of light emitting elements disposed near intersection points between the data electrodes and the selected electrodes in intersections between the data electrodes and the selected electrodes, the plurality of light emitting elements being linearly arrayed; a driving signal output circuit for generating a driving signal based on an image signal to supply the driving signal to the light emitting element arrays; and a column selection unit for switching the light emitting element arrays to be selected based on a lighting situation of each of the light emitting elements of each of the light emitting element arrays, wherein the photoreceptor is irradiated with a light based on the driving signal from the light emitting element array to expose the photoreceptor.

In order to achieve the object, a method for operating an exposure device which exposes a photoreceptor, the exposure device including a plurality of data electrodes disposed for each of a plurality of columns parallel to a moving direction of the photoreceptor; a plurality of selected electrodes disposed for each of a plurality of rows perpendicular to each of the data electrodes; a plurality of light emitting element arrays which include a plurality of light emitting elements disposed near intersection points between the data electrodes and the selected electrodes in intersections between the data electrodes and the selected electrodes, the plurality of light emitting elements being linearly arrayed;

the method comprising:
designating a selected electrode of a certain predetermined column among the plurality of selected electrodes and setting selected electrodes of the other columns to undesignated selected electrodes during image forming executed on a recording medium;
executing the image forming on the recording medium only by a light emitting element of a column connected to the designated selective electrode; and
switching the light emitting element arrays to be selected based on a lighting situation of each of the light emitting elements of each of the light emitting element arrays.

Preferably, the switching of the light emitting element arrays to be selected comprises switching the designating of the selected electrode to the selected electrode of another column every time the image forming executed on one recording medium is ended.

Preferably, the switching of the light emitting element arrays to be selected comprises switching the designating of the selected electrode to the selected electrode of another column every time the image forming executed on a plurality of recording media is ended.

Preferably, the switching of the light emitting element arrays to be selected comprises switching the designating of the selected electrode to the selected electrode of another column every time the image forming executed on a predetermined number of recording media within a predetermined period is ended.

Preferably, the switching of the light emitting element arrays to be selected comprises switching the designating of the selected electrode to the selected electrode of another column when a light emitting element superposed in the designated selected electrode reaches a predetermined temperature.

Preferably, the switching of the light emitting element arrays to be selected comprises switching the designating of the selected electrode to the selected electrode of another column when an applied current flowing through the light emitting element is reduced to a predetermined value due to time degradation of the light emitting element.

Preferably, the switching of the light emitting element arrays to be selected comprises switching the designating of the selected electrode to the selected electrode of another column when a voltage applied to the light emitting element increases to a predetermined value due to time degradation of the light emitting element.

Preferably, the switching of the light emitting element arrays to be selected comprises switching the designating of the selected electrode to the selected electrode of another column every time an image forming apparatus is started up.

In order to achieve the object, an exposure device for exposing a photoreceptor, comprises:
a light emission unit including a plurality of light emitting element arrays which comprise a plurality of light emitting elements which are linearly arrayed, and a plurality of first switching elements disposed so as to correspond to the plurality of light emitting elements, respectively, the light emission unit having a structure in which the light emitting element arrays are arranged in parallel;

a driving signal output circuit for generating a driving signal based on an image signal to supply the driving signal to the light emission unit; and a column selection unit for controlling turning ON/OFF of the plurality of first switching elements for each light emitting element array to select the light emitting element array to which the driving signal is applied via the first switching elements so as to correspond to each of predetermined number of light emitting elements, among the plurality of light emitting element arrays.

Preferably, the column selection unit switches the light emitting element array to be selected based on a lighting situation of each of the light emitting elements of each of the light emitting element arrays.

Preferably, the exposure device further comprises:

a dividing circuit including a circuit for dividing each of the driving signals supplied from the driving signal output circuit so as to correspond to the predetermined number of light emitting elements of the light emitting element array, and a plurality of second switching elements disposed so as to correspond to each of the divided driving signals to interrupt application of the divided driving signals to each of the predetermined number of light emitting elements; and a division control circuit for controlling turning ON/OFF of the second switching elements by timings which are different from one another, to control the application of the divided driving signals to each of the predetermined number of light emitting elements.

Preferably, the driving signal output circuit time-sequentially supplies the driving signals corresponding to each of the predetermined number of light emitting elements of the light emitting element array, and the division control circuit controls turning ON/OFF of the second switching elements according to time-sequential timing of the driving signals supplied from the driving signal output circuit.

Preferably, the exposure device further comprises:

a plurality of third switching elements which are disposed between each of the second switching elements and each of the first switching elements of the light emitting element array and in which a predetermined power supply voltage is applied to one end of a current path, the other end of the current path is connected to the first switching elements, and in which the divided driving signals are applied to control terminals; and a holding circuit disposed in the control terminal of each of the third switching elements to hold voltage components corresponding to the applied divided driving signals.

Preferably, the exposure device further comprises a lighting time control circuit for controlling application time of the power supply voltage applied to one end of the current path of the third switching element to control lighting time of the light emitting element of the light emitting element array.

In order to achieve the object, an image forming apparatus for forming an image on a recording medium, comprises:

a photosensitive drum including a photoreceptor; and an exposure device for irradiating the photoreceptor of the photosensitive drum with a light based on an image signal to expose the photoreceptor, and for executing printing on the recording medium according to the image signal, wherein the exposure device comprises:

a light emission unit including a plurality of light emitting element arrays which comprise a plurality of light emitting elements which are linearly arrayed, and a plurality of first switching elements disposed so as to correspond to the plurality of light emitting elements, respectively, the light emission unit having a structure in which the light emitting element arrays are arranged in parallel;

a driving signal output circuit for generating a driving signal based on an image signal to supply the driving signal to the light emission unit; and a column selection unit for controlling turning ON/OFF of the plurality of first switching elements for each light emitting element array to select the light emitting element array in which the driving signal is applied to each of the light emitting elements via the first switching elements, among the plurality of light emitting element arrays of the light emission unit.

Preferably, the column selection unit switches the light emitting element array to be selected based on a predetermined condition according to a lighting situation of the plurality of light emitting elements of each of the light emitting element arrays.

Preferably, the image forming apparatus further comprises:

a dividing circuit including a circuit for dividing each of the driving signals supplied from the driving signal output circuit so as to correspond to the predetermined number of light emitting elements of the light emitting element array, and a plurality of second switching elements disposed so as to correspond to each of the divided driving signals to interrupt application of the divided driving signals to each of the predetermined number of light emitting elements; and a division control circuit for controlling turning ON/OFF of the second switching elements by timings which are different from one another, to control the application of the divided driving signals to each of the predetermined number of light emitting elements.

Preferably, the image forming apparatus further comprises:

a plurality of third switching elements which are disposed between each of the second switching elements and each of the predetermined number of light emitting elements of the light emitting element array and in which a predetermined power supply voltage is applied to one end of a current path, the other end of the current path is connected to the first switching elements of the light emitting element array, and in which the divided driving signals are applied to control terminals; and a holding circuit disposed in the control terminal of each of the third switching elements to hold voltage components corresponding to the applied divided driving signals.

BRIEF DESCRIPTION OF THE DRAWINGS

The present invention will become more fully understood from the detailed description given hereinafter and the accompanying drawing given by way of illustration only, and thus are not intended as a definition of the limits of the present invention, and wherein.

PREFERRED EMBODIMENTS OF THE INVENTION

The preferred embodiments of the present invention will be described with reference to the accompanying drawings. The embodiments include various technically preferable qualifications. However, a scope of the invention is not limited to the embodiments and shown examples. In the description below, a term "electroluminescent" will be abbreviated to EL.

A. First Embodiment

Figure 1:
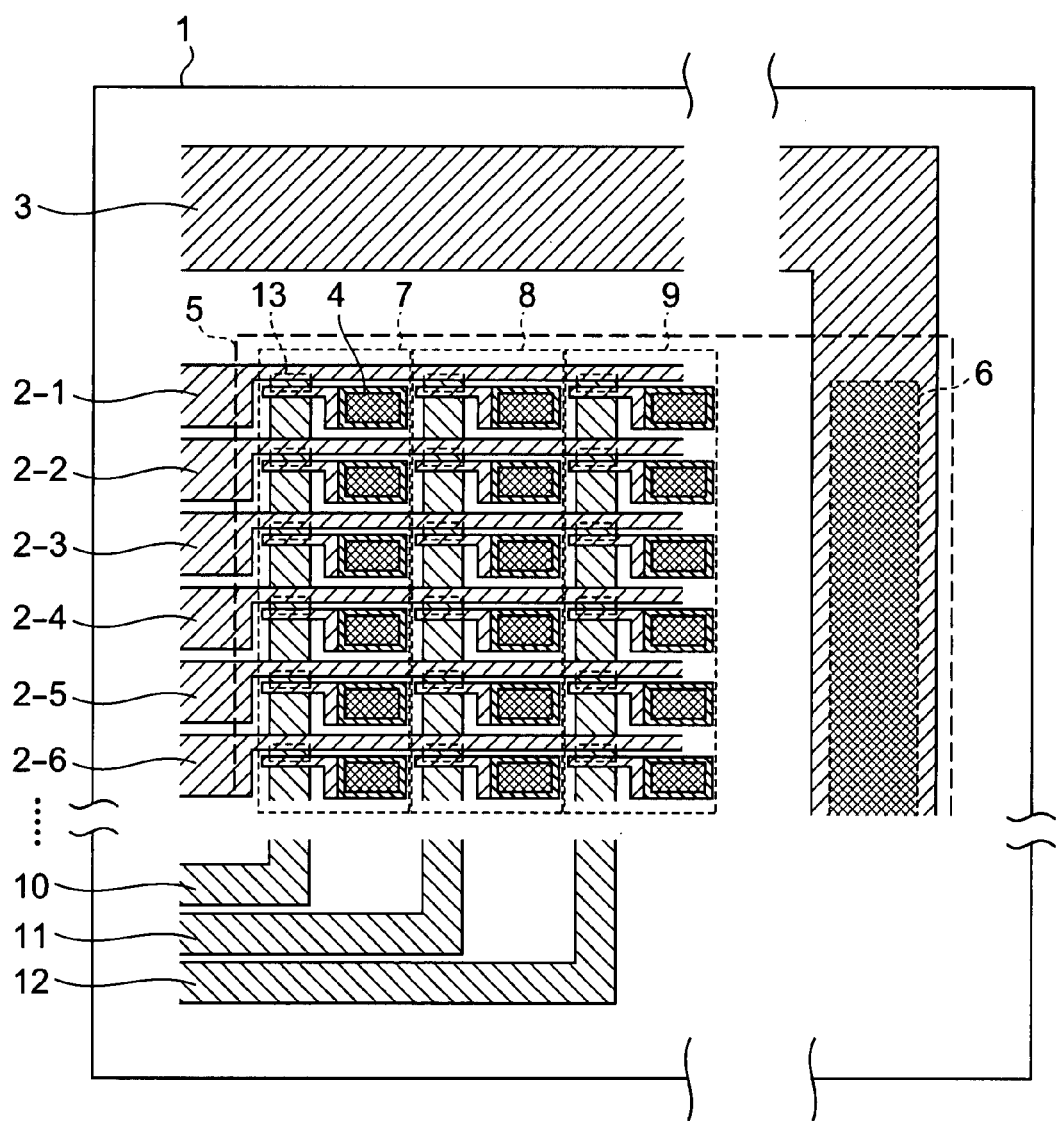
FIG. 1 is a plan view showing a structure of a light emitting element substrate of an exposure device according to a first embodiment of the present invention.
Figure 2:
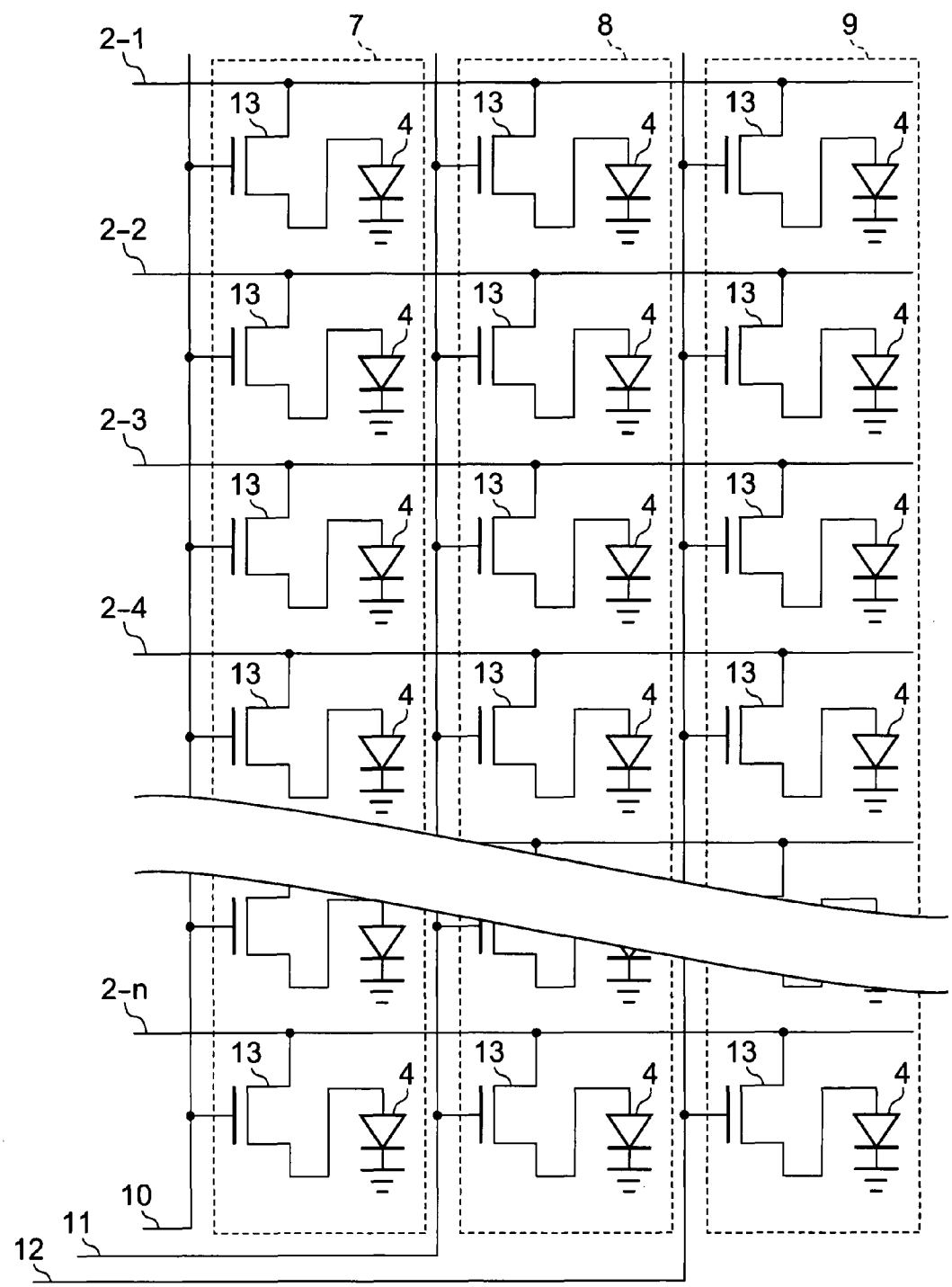
FIG. 2 is a circuit diagram showing the structure of the light emitting element substrate of the exposure device of the first embodiment through an equivalent circuit.

FIG. 1 is a plan view showing a structure of a light emitting element substrate 1 of an exposure device according to a first embodiment of the present invention. FIG. 2 is a circuit diagram showing the structure of the light emitting element substrate 1 of the exposure device of the first embodiment through an equivalent circuit. This structure will be described by way of structure which includes a bottom emission type organic EL light emitting element. However, the invention can similarly be realized even by a top emission type.

As shown in FIGS. 1 and 2, three 1-dimensional light emitting element arrays 7 to 9 are arranged in a plurality of columns (3 columns according to the embodiment) on the light emitting element substrate (light emission unit) 1. In the light emitting element arrays 7 to 9, column selection thin film transistors (TFT's: first switching elements) 13, 13, . . . in which column selection gate wiring lines 10 to 12 common among columns are gate electrodes, and light emitting elements 4, 4, . . . having organic EL elements are arranged. Drain electrodes of the column selection TFT's 13, 13, . . . of the columns are connected to data output lines 2-1, 2-2, . . . , and a source side is connected to a data electrode of the light emitting element 4. In other words, a plurality of data electrodes of the light emitting elements 4, 4, . . . are connected to the data output lines 2-1, 2-2, . . . via the column selection TFT's 13, 13, . . . . Accordingly, by supplying selected potentials to optional column selection gate wiring lines 10 to 12, optional light emitting elements 7 to 9 can be selectively driven.

Selected electrodes of the light emitting elements 4, 4, . . . are disposed in common for all the light emitting elements 4, 4, . . . of the light emitting element arrays 7 to 9, and formed by depositing aluminum or the like (transparent electrode of ITO or the like in the case of top emission) on a selected electrode forming unit 5. The selected electrode is connected to a selected electrode connection unit 6 formed in a selection takeout line 3. FIG. 1 shows a structure in which 1-dimensional light emitting arrays are arranged in three columns. However, the arrays may be arranged in two columns, or four or more columns.

Next, an example of a manufacturing process of the light emitting element substrate 1 of the exposure device will be described.

The manufacturing process of the light emitting element substrate 1 of the exposure device is as follows.

(1) A data wiring line, a data electrode, and a selected wiring line extraction unit are patterned to be formed on the substrate by a transparent electrode of ITO or the like through a photolithography process.

(2) After an insulating film is similarly formed through the photolithography process, a light emission unit, an opening of an electrode connection unit, and a wiring line connection terminal unit are formed.

(3) A multilayer film of a low molecular organic EL layer is formed to cover the entire light emission unit with a metal mask or the like.

In the case of a high molecular organic EL, coating and backing are repeated by an ink jet system, a coater or the like to form an organic EL multilayer film.

(4) Through a deposition process or the like, by using a metal mask, for example, a selected electrode is integrally formed using a metal Al material. Simultaneously, each selected electrode and the selected wiring line connection terminal unit of the substrate are electrically connected to each other through the insulating film opening of the electrode connection unit.

(5) The light emission unit of the substrate is sealed by a sealant and a sealing substrate.

(6) A driving control circuit is connected to the terminal unit.

A lighting circuit and a memory circuit may be arranged for each data by using a TFT substrate to build a matrix structure.

(7) An imaging optical element is arranged between the substrate having the plurality of light emitting elements and the photoreceptor.

Figure 3:
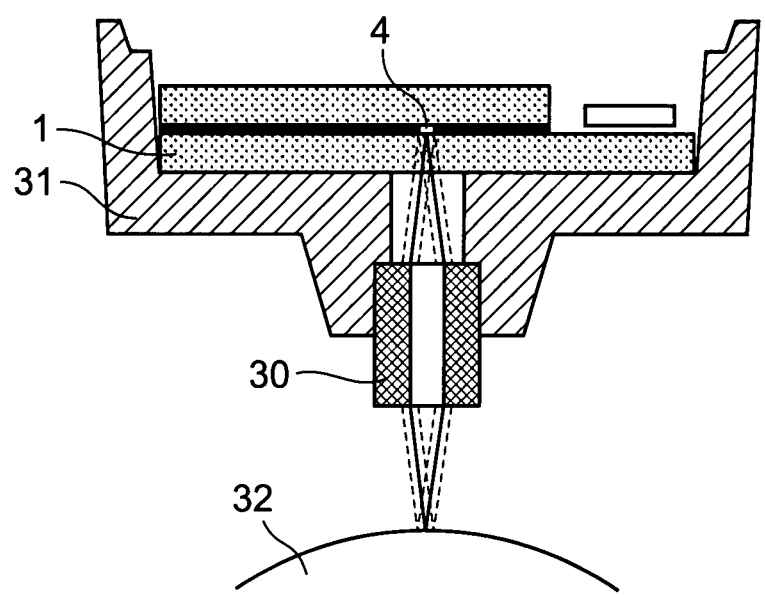
FIG. 3 is a schematic view showing an example of an exposure head which uses the exposure device of the first embodiment.

FIG. 3 is a schematic view showing an example of a structure of an exposure head which uses the exposure device of the first embodiment. The exposure device includes a rod lens 30 which is an imaging optical element between the light emitting element 4 of the light emitting element substrate 1 and a photosensitive drum 32. A housing 31 has a structure in which the light emitting element substrate 1 and the rod lens 30 are integrated. A light emitted from the light emitting element 4 is converged by the rod lens 30 to be applied to the photoreceptor 32.

Figure 4:
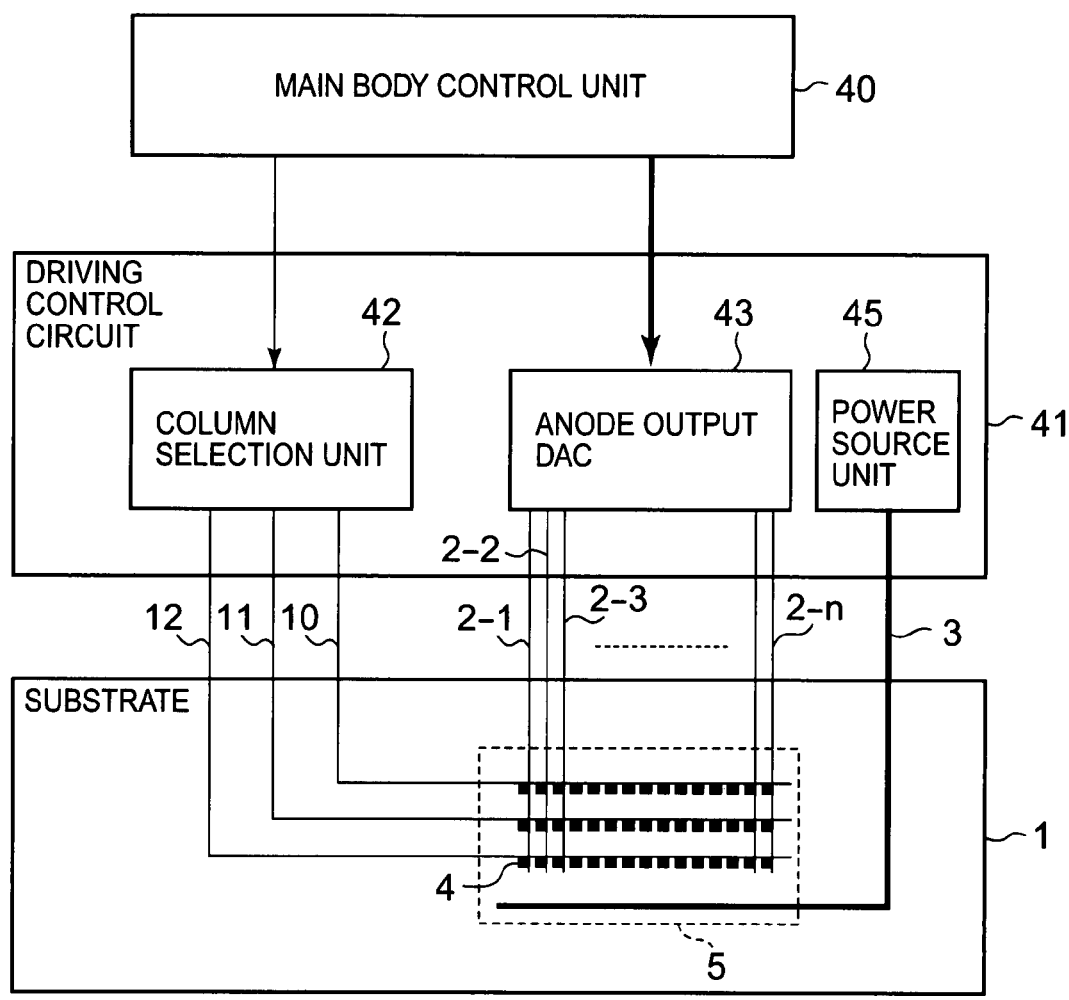
FIG. 4 is a block diagram showing a configuration of a controller of the exposure device of the first embodiment.

FIG. 4 is a block diagram showing a configuration of a controller of the exposure device of the first embodiment. A main body control circuit 40 generates lighting data (image signal) of the exposure device based on print image data, outputs the lighting data to a driving control circuit 41, decides which column of a plurality of light emitting element arrays 7 to 9 is used on the light emitting element substrate 1, and outputs a selection signal for selecting the decided optional column to the driving control circuit 41.

Regarding which column of the plurality of light emitting element arrays 7 to 9 is used, predetermined switching conditions are set beforehand to prevent continuous use of the same column of light emitting element arrays. When the switching conditions are established, a light emitting element array of a column unit to be used is switched. As the switching conditions, a lighting situation of a light emitting element of each column, for example, the number of output pages, a life of an organic LED emission unit, a temperature increase, a reduction of an applied current, and an increase of an applied voltage may be used.

The driving control circuit 41 includes a column selection unit 42, a data output unit (driving signal output circuit) 43, and a power source unit 45. The column selection unit (column selection unit) 42 drives a column selection TFT 13 to be ON/OFF by a column selection gate signal via column selection gate wiring lines 10 to 12 of a designated column according to a column selection signal. Accordingly, one of the designated light emitting element arrays 7 to 9 can be optionally selected to be operated. The data output unit 43 includes, for example, a digital analog converter (DAC), converts the lighting data into an analog signal (driving signal) for lighting the organic EL light emitting element, and outputs the analog signal to the light emitting element substrate 1 via data output lines 2-1, 2-2, . . . . The analog output is preferably a constant current output. However, the analog output may be a constant voltage output. The power source unit 45 sets a selection takeout line 3 to a predetermined potential.

Figure 5:
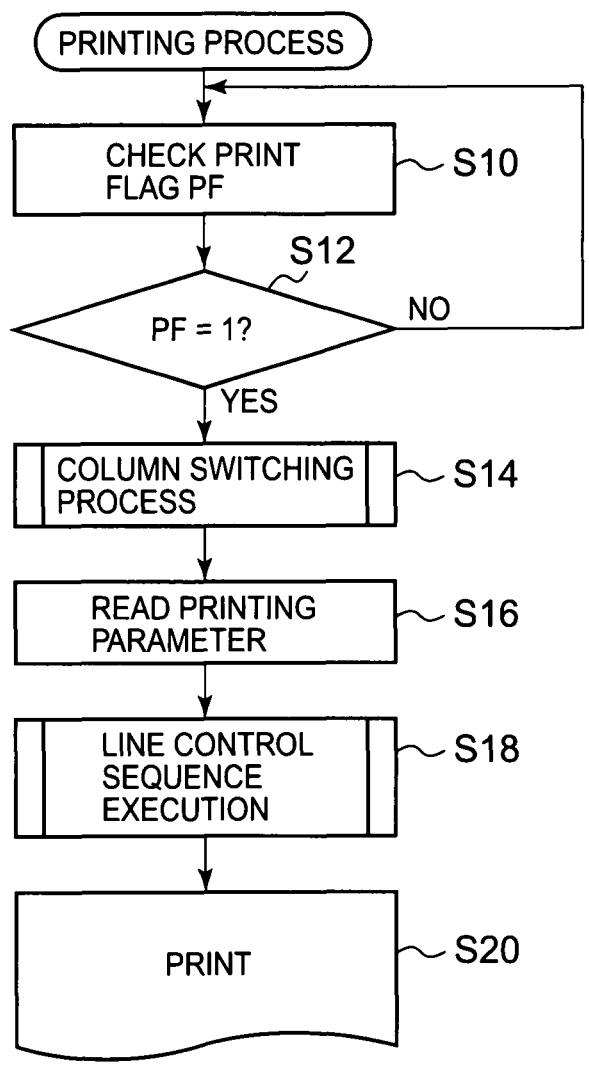
FIG. 5 is a flowchart showing an operation of an image forming apparatus which uses an organic EL exposure device of the first embodiment.

FIG. 5 is a flowchart (main routine) showing an operation of an image forming apparatus which uses the exposure device of the first embodiment. First, a print flag PF is checked (step S10) to determine whether the print flag PF is "1" (step S12). If the print flag PF is not "1", the process returns to the step S10 determining that printing is yet to be prepared.

On the other hand, if the print flag PF is "1", a column switching process is executed (step S14). According to the column switching process, the light emitting element arrays 7 to 9 are switched as light emitting element arrays used for image forming. Switching conditions are, for example, as follows.

(1) The light emitting element arrays are switched for each print page.

(2) The light emitting element arrays are switched for each prescribed number of print pages by a page counter.

(3) The light emitting element arrays are switched by the page counter at estimated life reaching time of light emitting elements.

(4) The light emitting element arrays are switched when a prescribed number of pages are printed within prescribed time.

(5) The light emitting element arrays are switched when the light emitting elements reach a prescribed temperature or more (temperature increase is equal to or more than the prescribed temperature).

(6) The light emitting element arrays are switched when an applied current is reduced to a prescribed value during constant voltage driving.

(7) The light emitting element arrays are switched when an applied voltage is increased to a prescribed value during constant current driving.

In short, when the conditions are satisfied, the light emitting element arrays 7 to 9 are switched. At this time, as a printing parameter, a Line control sequence for causing a selected light emitting element to emit a light is written in the main body control circuit 40. Then, the Line control sequence is read from the printing parameter (step S16). The Line control sequence is executed (step S18) to carry out printing (step S20).

Next, the column switching process will be described.

(1) Switching for Each Print Page

Figure 6:
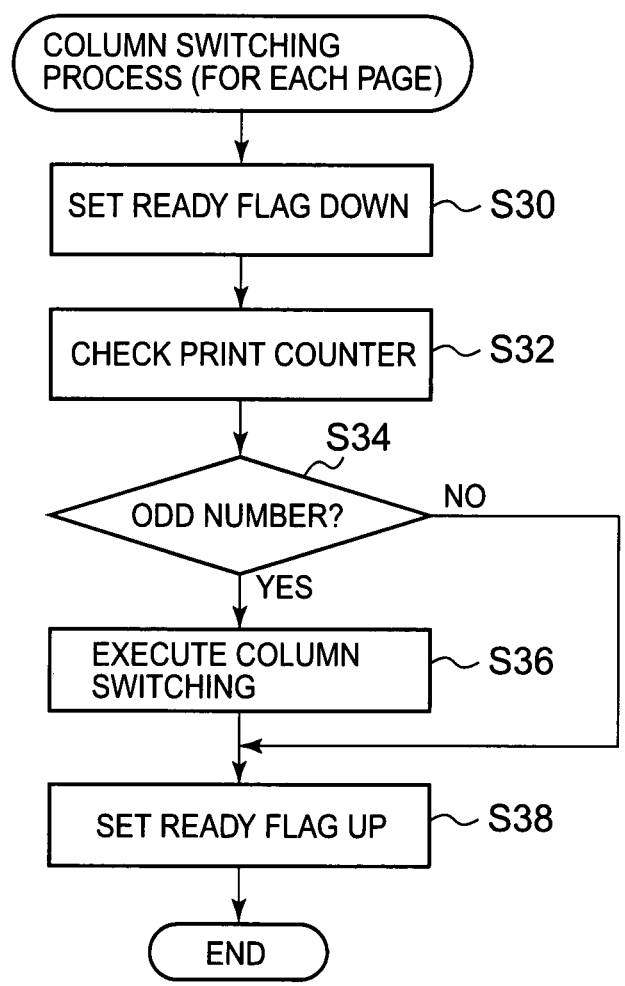
FIG. 6 is a flowchart showing an operation of a column switching process (for each print page) of the image forming apparatus of the first embodiment.

FIG. 6 is a flowchart showing an operation when a column switching process of the image forming apparatus of the first embodiment is executed for each print page. First, a READY flag is set down (step S30) to check a print counter (step S32). In this case, the print counter counts the number of printed pages (two surfaces constitute one page).

Subsequently, whether the print counter indicates an odd-number value (step S34). If an odd-number value is indicated, the light emitting element arrays 7 to 9 used for image forming are switched (step S36). On the other hand, if an odd-number value is not indicated, the light emitting element arrays 7 to 9 are not switched. Then, the READY flag is set up (step S38) to return to the main routine.

(2) Switching for Reach Prescribed Number of Print Pages by Page Counter

Figure 7:
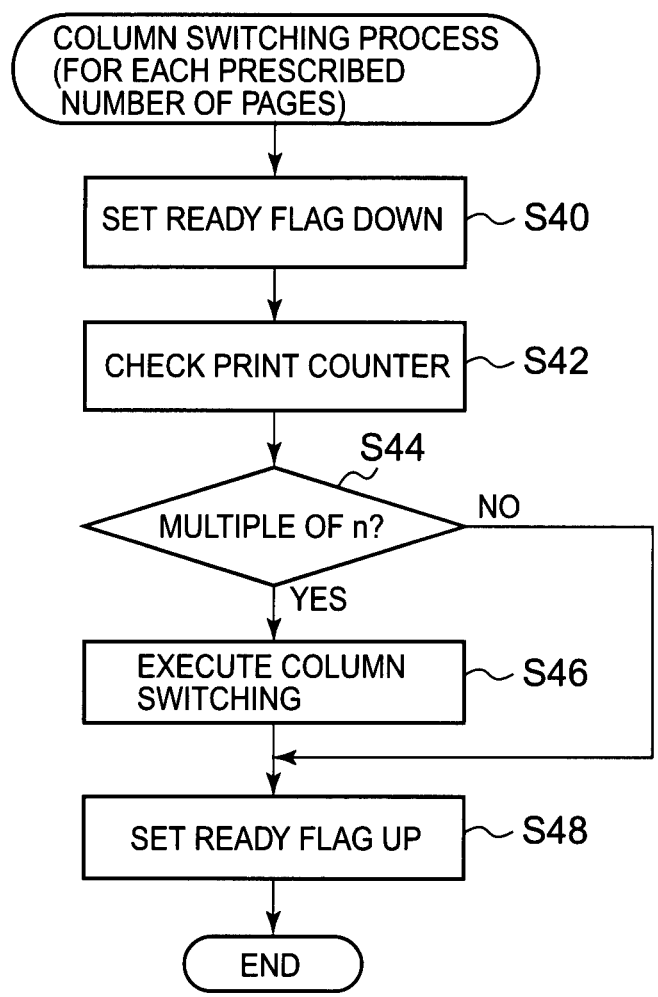
FIG. 7 is a flowchart showing an operation of a column switching process (for each prescribed number of pages) of the image forming apparatus of the first embodiment.

FIG. 7 is a flowchart showing an operation when a column switching process of the image forming apparatus of the first embodiment is executed for each prescribed number of pages. First, the READY flag is set down (step S40) to check the print counter (step S42). In this case, the print counter counts the number of printed pages (two surfaces constitute one page).

Subsequently, whether the print counter indicates a multiple of a preset prescribed number of pages n (e.g., n=20, 30, 40, . . . ) (step S44). If a multiple of n is indicated, the light emitting element arrays 7 to 9 used for image forming are switched (step S46). Accordingly, for example, with n=20, the light emitting element arrays are switched for every 20 pages. On the other hand, if a multiple of n is not indicated, the light emitting element arrays 7 to 9 are not switched. Then, the READY flag is set up (step S48) to return to the main routine.

Figure 8:
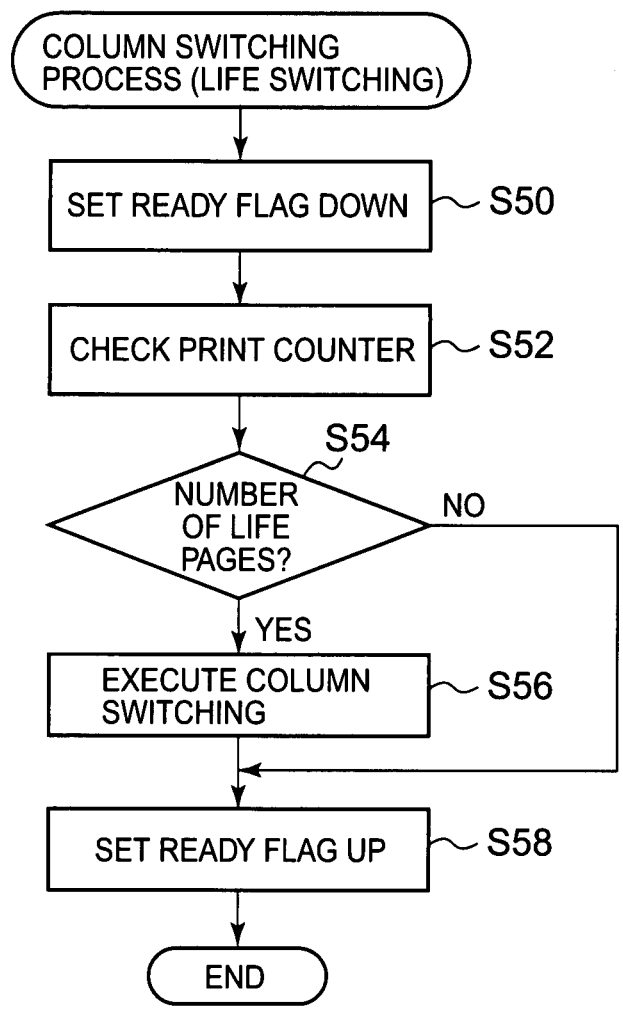
FIG. 8 is a flowchart showing an operation of a column switching process (estimated life reaching time) of the image forming apparatus of the first embodiment.

(3) Switching by Page Counter at Estimated Life Reaching Time of Light Emitting Elements FIG. 8 is a flowchart showing an operation when a column switching process of the image forming apparatus of the first embodiment is executed at estimated life reaching time. First, a READY flag is set down (step S50) to check the print counter (step S52). In this case, the print counter counts the number of printed pages (two surfaces constitute one page).

Subsequently, whether the print counter has reached a preset number of life pages of the light emitting elements (e.g., 5000, or 10000) (step S54) is determined. If the number of life pages has been reached, the light emitting element arrays 7 to 9 used for image forming are switched (step S56). Accordingly, for example, if the number of life pages is 5000, the light emitting element arrays are switched when the number of printed pages reaches 5000. On the other hand, if the number of life pages has not been reached, the light emitting element arrays 7 to 9 are not switched. Then, the READY flag is set up (step S58) to return to the main routine.

Figure 9:
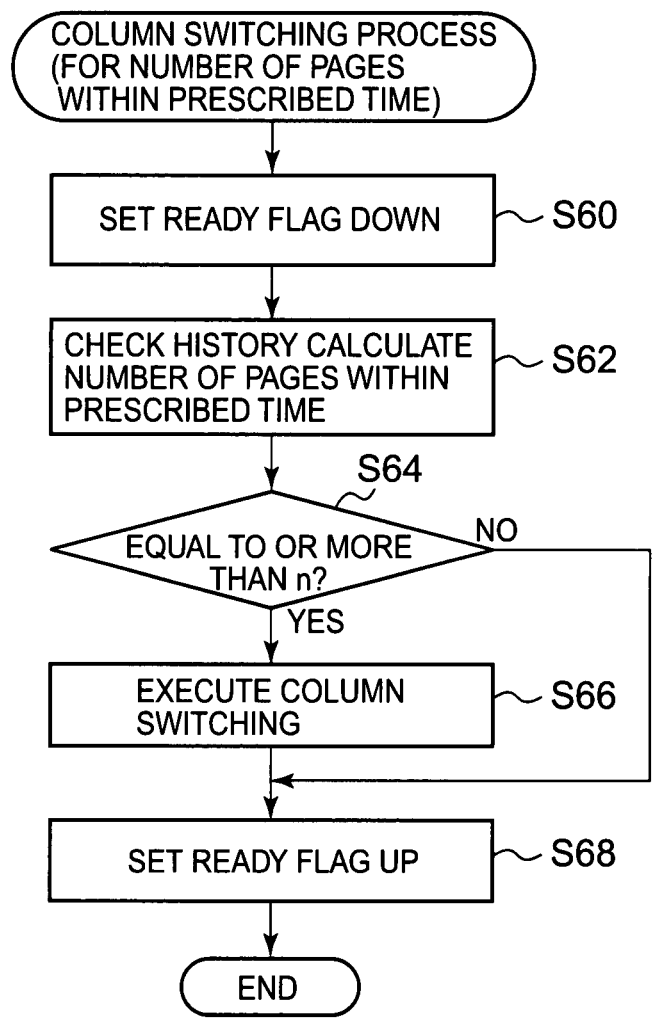
FIG. 9 is a flowchart showing an operation of a column switching process (prescribed number of pages within prescribed time) of the image forming apparatus of the first embodiment.

(4) Switching When a Prescribed Number of Pages is Printed within Prescribed Time FIG. 9 is a flowchart showing an operation when a column switching process of the image forming apparatus of the first embodiment is executed when the number of printed pages within prescribed time reaches a prescribed number of pages. First, a READY flag is set down (step S60), and checks history to calculate the number of printed pages within the prescribed time (step S62). In this case, use time and the number of printed pages (two surfaces constitute one page) are recorded in the history. The prescribed time is, for example, 1 hour or 5 hours.

Subsequently, whether the number of printed pages within the prescribed time is equal to or more than a prescribed number of pages n (e.g., n=100, 500 or the like) (step S64). If the number of printed pages within the prescribed time is equal to or more than n, the light emitting element arrays 7 to 9 used for image forming are switched (step S66). Accordingly, for example, if 100 or more are printed per hour, the light emitting element arrays are switched at this time. On the other hand, if the number of printed pages within the prescribed time is not equal to or more than n, the light emitting element arrays 7 to 9 are not switched. Then, the READY flag is set up (step S68) to return to the main routine.

(5) Switching When Light Emitting Elements Reach a Prescribed Temperature or More (Temperature Increase is Equal to or More than the Prescribed Temperature)

Figure 10:
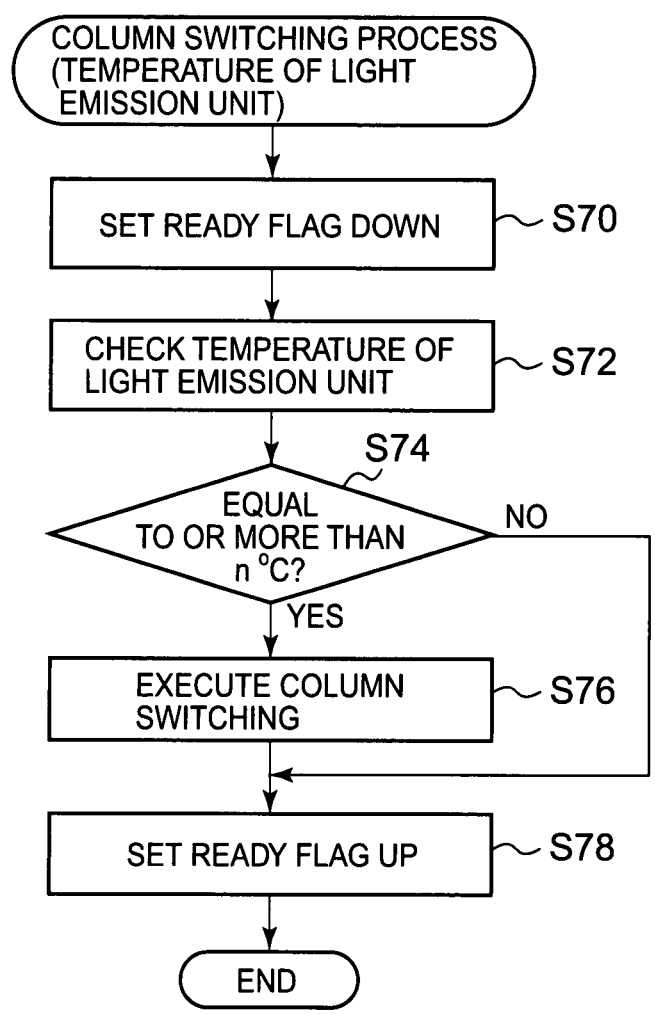
FIG. 10 is a flowchart showing an operation of a column switching process (when light emission unit is at a prescribed temperature or more (or the prescribed temperature increases)) of the image forming apparatus of the first embodiment.

FIG. 10 is a flowchart showing an operation when a column switching process of the image forming apparatus of the first embodiment is executed when the light emitting elements reach a prescribed temperature or more (or a temperature increase is equal to or more than the prescribed temperature). It is known that characteristic deterioration of a light emitting element having an organic EL element is expedited by an increase of the temperature. Thus, first, a READY flag is set down (step S70) to check a temperature of the light emitting elements (step S72) In this case, a temperature sensor is disposed near the light emitting elements to detect the temperature of the light emitting elements. Whether the temperature or the temperature increase of the light emitting elements is equal to or more than a preset prescribed temperature n° C. (e.g., n=70° C., 80° C., . . . ) is determined (step S74).

Subsequently, if the temperature or the temperature increase of the light emitting elements is equal to or more than n° C., the light emitting element arrays 7 to 9 used for image forming are switched (step S76). Accordingly, for example, when the temperature of the light emitting elements reaches 80° C. or more, the light emitting element arrays are switched. On the other hand, if the temperature of the light emitting elements is less than n° C., the light emitting element arrays 7 to 9 are not switched. Then, the READY flag is set up (step S78) to return to the main routine.

Figure 11:
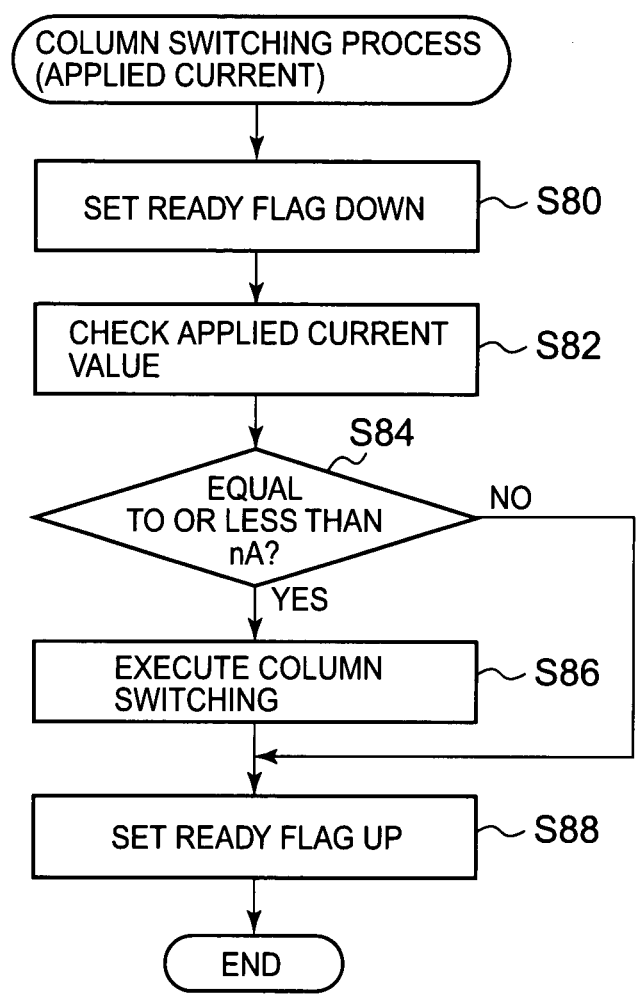
FIG. 11 is a flowchart showing an operation of a column switching process (reduction of applied current) of the image forming apparatus of the first embodiment.

(6) Switching When an Applied Current is Reduced Below a Prescribed Value During Constant Voltage Driving FIG. 11 is a flowchart showing an operation when a column switching process of the image forming apparatus of the first embodiment is executed at the time of reduction of an applied current during constant voltage driving. It is known that a light emitting element having an organic EL element tends to be gradually increased in resistance and reduced in current flowing through the light emitting element due to the time degradation when a light emitting operation is continuously carried out by a constant voltage applied to supply a current. Accordingly, first, a READY flag is set down (step S80) to check a value of a current applied to the light emitting element when a predetermined constant voltage is applied to the light emitting element (step S82). In this case, an ammeter is disposed to detect a current applied to the light emitting element. Subsequently, whether the applied current value to the light emitting element is equal to or less than a predetermined determination current nA is determined (step S84). If the applied current value to the light emitting element is equal to or less than the determination current nA, the light emitting element arrays 7 to 9 used for image forming are switched (step S86). On the other hand, if the applied current value to the light emitting element is more than the determination current nA, the light emitting element arrays 7 to 9 are not switched. Then, the READY flag is set up (step S88) to return to the main routine.

Figure 12:
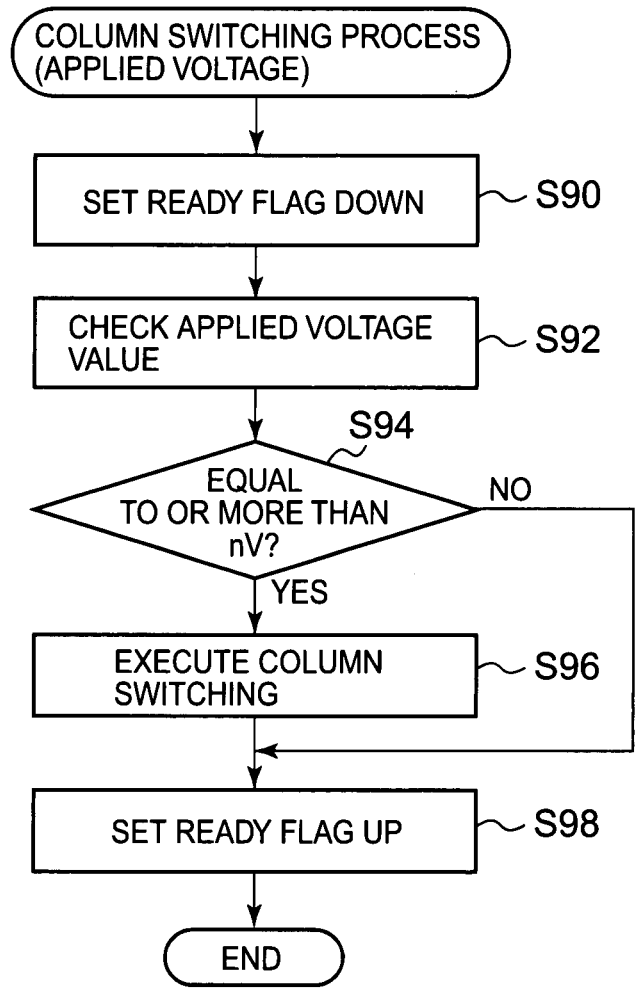
FIG. 12 is a flowchart showing an operation of a column switching process (increase of applied voltage) of the image forming apparatus of the first embodiment.

(7) Switching When an Applied Current Exceeds a Prescribed Value During Constant Current Driving FIG. 12 is a flowchart showing an operation when a column switching process of the image forming apparatus of the first embodiment is executed at the time of increase of an applied voltage during constant current driving. It is known that a light emitting element having an organic EL element tends to be gradually increased in resistance due to the time degradation time degradation when a light emitting operation is continuously carried out, and an applied voltage value increases because of the high resistance when a constant current is applied. Accordingly, first, a READY flag is set down (step S90) to check a value of a voltage applied to the light emission unit (step S92). In this case, a voltmeter is disposed to detect a voltage applied to the light emitting element. Subsequently, whether the applied voltage value to the light emitting element is equal to or less than a predetermined determination voltage nV is determined (step S94). If the applied voltage value to the light emitting element is equal to or less than the determination voltage nV, the light emitting element arrays 7 to 9 used for image forming are switched (step S96). On the other hand, if the applied voltage value to the light emitting element is less than the determination voltage nV, the light emitting element arrays 7 to 9 are not switched. Then, the READY flag is set up (step S98) to return to the main routine.

Figure 13:
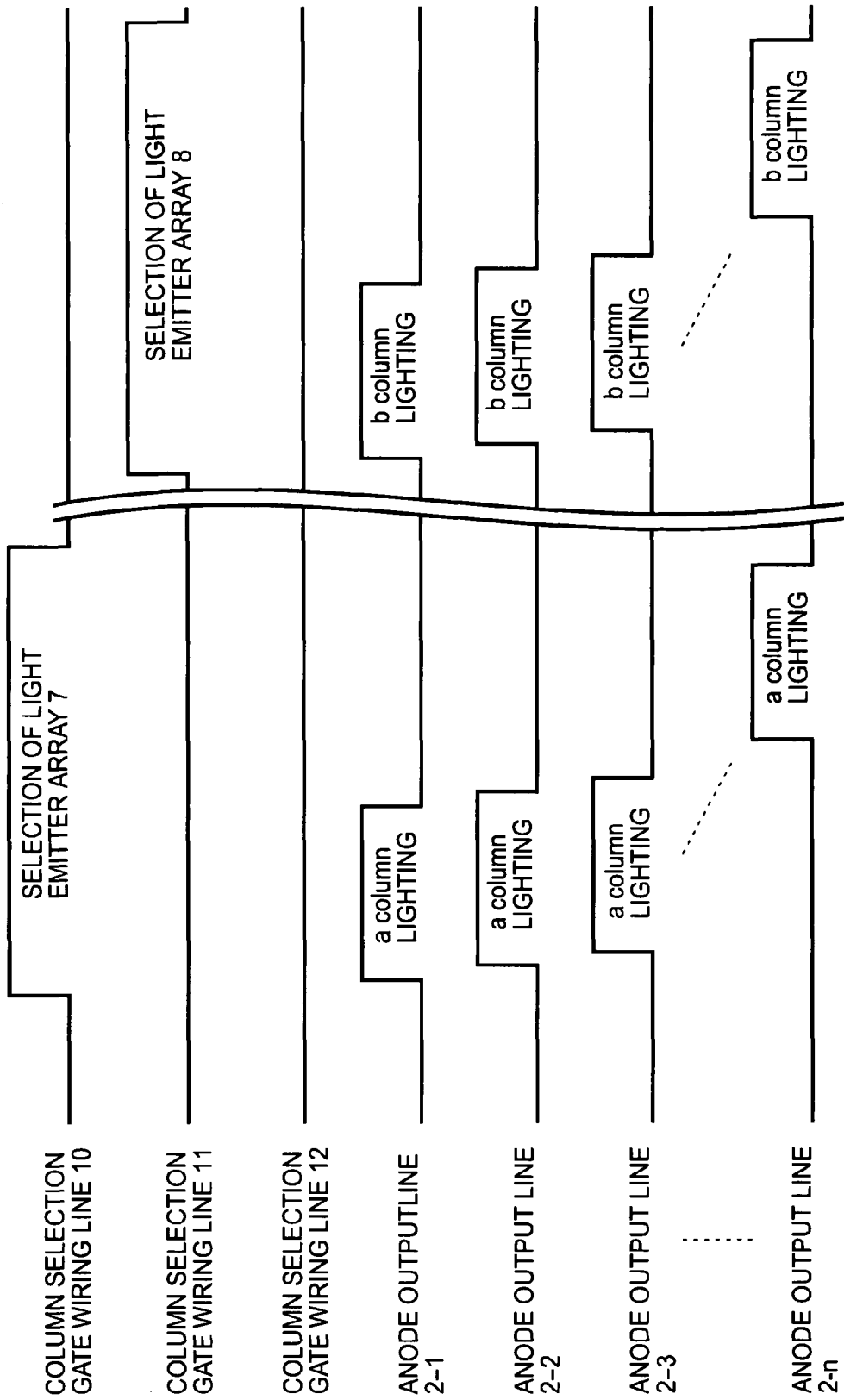
FIG. 13 is a timing chart showing an operation of the exposure device of the first embodiment.

FIG. 13 is a timing chart showing an operation of the exposure device of the first embodiment. Hereinafter, the light emitting element arrays 7 to 9 will be described respectively as an "a" column, a "b" column, and a "c" column. First, the main body control circuit 40 decides which column of the plurality of light emitting element arrays 7 to 9 is used based on predetermined switching conditions (e.g., "a" column), and supplies a selection signal for selecting the decided column to the driving control circuit 41. In other words, as shown in FIG. 13, for example, a column selection gate wiring line 10 is set to a high level, while other selection gate wiring lines 11 and 12 are set to low levels. Thus, the light emitting element array 7 of the selected "a" column is selected.

The main body control circuit 40 generates lighting data based on print image data to supply the data to the driving control circuit 41. The driving control circuit 41 converts the light data into an analog output for lighting the organic EL light emitting element by predetermined timing to output the same to the light emitting element substrate 1 via the data output lines 2-1, 2-2, . . . . As a result, the light emitting elements 4, 4, . . . emit lights in the light emitting element array 7 of the selected "a" column. In this case, the other light emitting element arrays, i.e., the light emitting element arrays 8 and 9 of the "b" and "c" columns are not used. Thereafter, until switching conditions are established, the light emitting elements 4, 4, . . . of the light emitting element array 7 of the "a" column emit lights, and are used for forming images.

Upon establishment of the switching conditions, the main body control circuit 40 decides which column of the plurality of light emitting element arrays 7 to 9 is used (e.g., "b" column), and supplies a selection signal for selecting the decided column to the driving control circuit 41. In other words, as shown in FIG. 13, the column selection gate wiring line 11 is set to a high level, while the other selection gate wiring lines 10 and 12 are set to low levels. Accordingly, the light emitting element array 8 of the selected "b" column is selected.

Then, the main body control circuit 40 generates lighting data based on the print image data to supply the data to the driving control circuit 41. The driving control circuit 41 converts the lighting data into an analog output for lighting the organic EL light emitting element, and outputs the same to the light emitting element substrate via the data output lines 2-1, 2-2, . . . . In this case, the other light emitting arrays, i.e., the light emitting element arrays 7 and 8 of the "a" and "c" columns are not used. Hereinafter, similarly, the light emitting element arrays are switched upon each establishment of switching conditions.

According to the first embodiment, the plurality of light emitting element arrays 7 to 9 can be selectively operated. Thus, as the light emitting element array of the same column is not used continuously, the life can be prolonged more by the number of columns than a case in which there is only one column of a light emitting element array.

The exposure itself is carried out by the light emitting element column of one column without executing multiple exposure. Thus, the exposure can be realized by a simple circuitry.

The light emitting element arrays 7 to 9 of plural columns can be selectively operated. Thus, for example, when a column in which a defective dot is generated is found during production, a column of no defective dot may be selected. In this case, a yield ratio is increased.

Furthermore, as the selected electrodes can be uniformly formed with large areas, the selective wiring lines can be maintained at low resistance even when the exposure device is enlarged.

B. Second Embodiment

Next, a second embodiment of the present invention will be described.

The second embodiment is characterized by disposing an active matrix lighting circuit including a TFT of amorphous silicon or the like on a light emitting element substrate.

Figure 14:
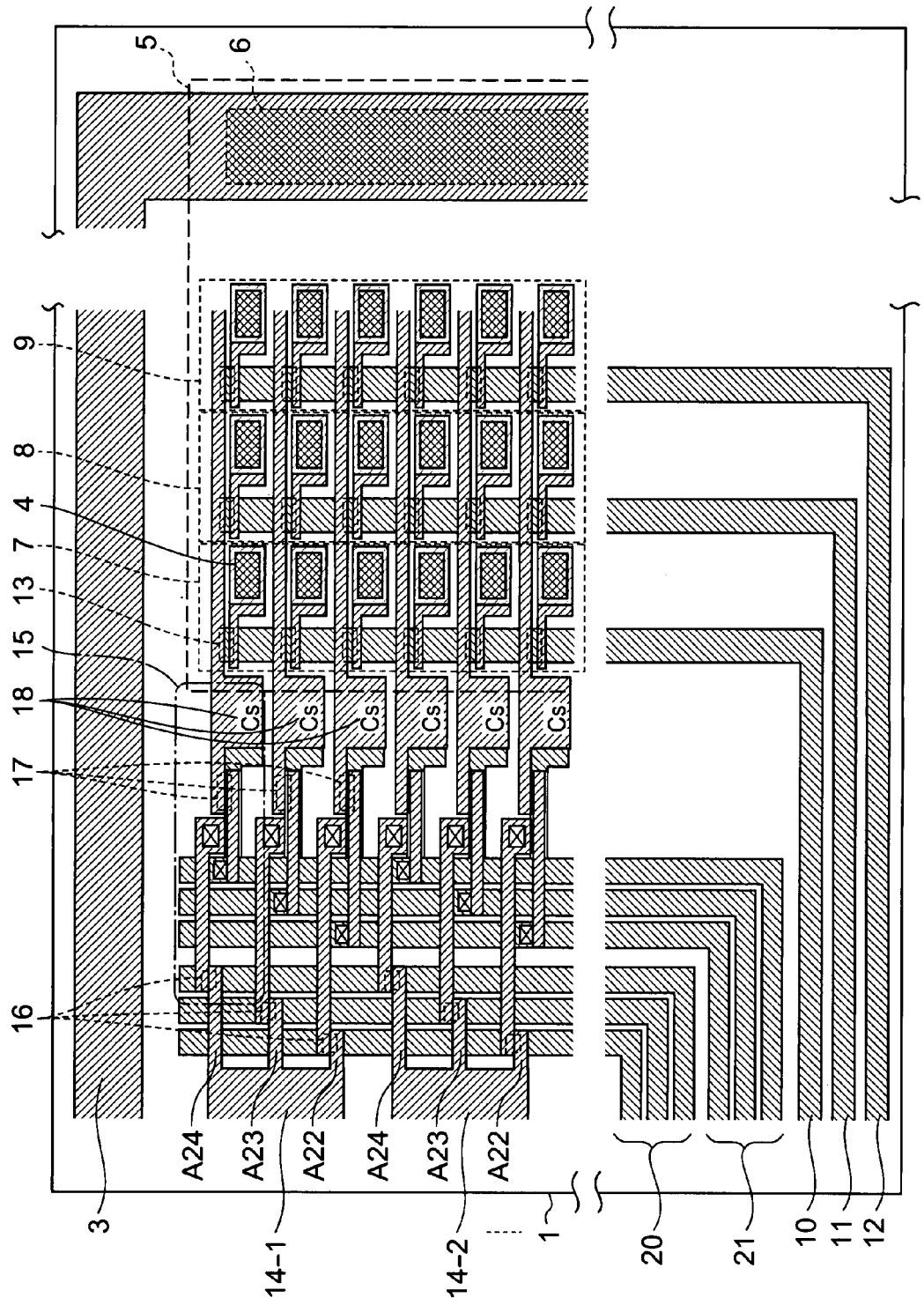
FIG. 14 is a plan view showing a structure of an exposure device according to a second embodiment of the present invention.
Figure 15:
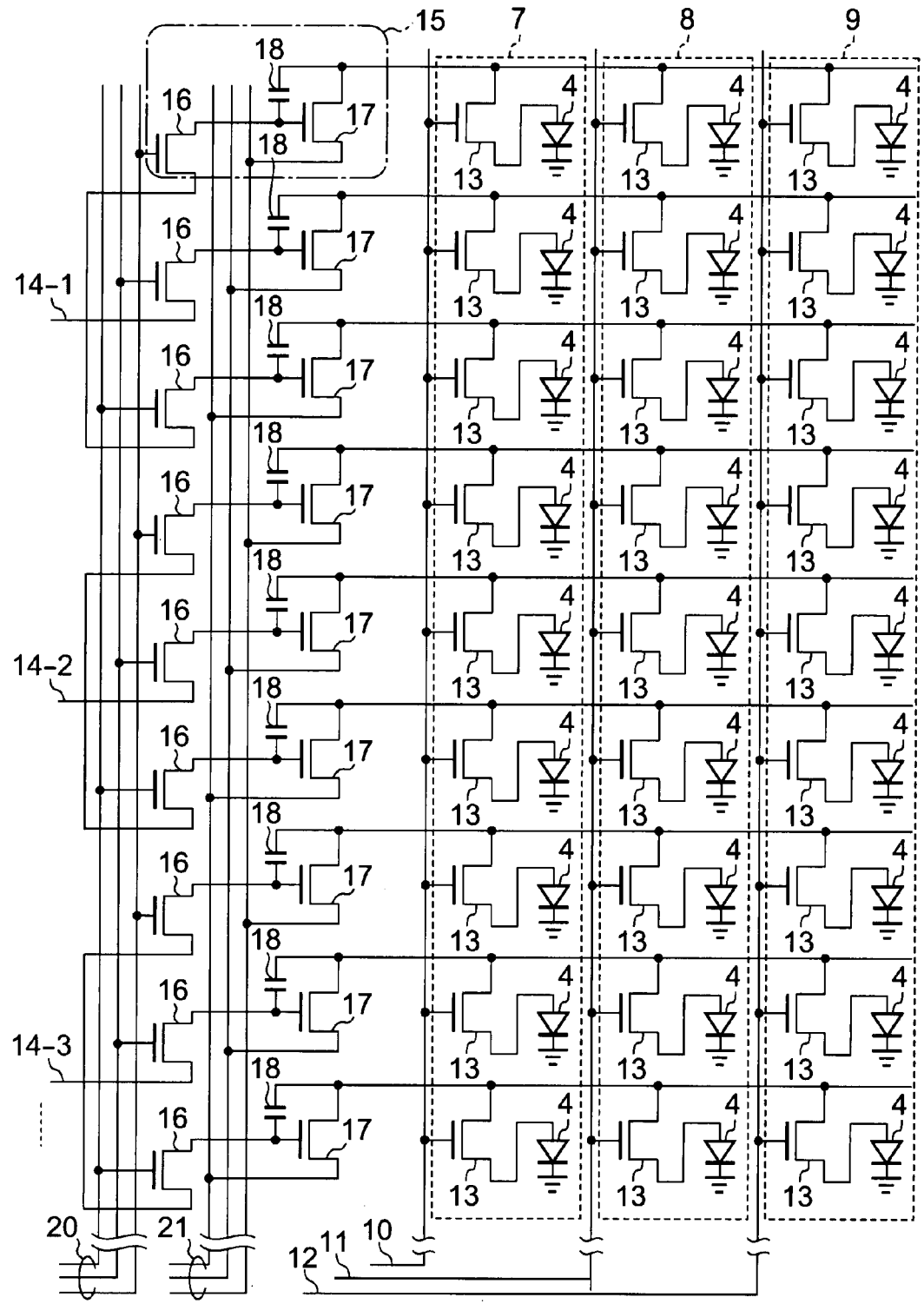
FIG. 15 is a circuit diagram showing the structure of the exposure device of the second embodiment through an equivalent circuit.

FIG. 14 is a plan view showing a structure of a light emitting element substrate 1 of an exposure device according to the second embodiment of the present invention. FIG. 15 is a circuit diagram showing the structure of the light emitting element substrate 1 of the exposure device of the second embodiment through an equivalent circuit. This structure will be described by way of structure which includes a bottom emission type organic EL light emitting element. However, the invention can be similarly realized by a top emission type. Portions corresponding to those of FIG. 1 will be denoted by similar reference numerals, and description thereof will be omitted.

In the drawings, a reference numeral 15 is a lighting circuit structured in a manner that a constant voltage lighting circuit includes two transistors (TFT's 16 and 17) and a capacitor (capacitance formation unit 18). As in the case of the first embodiment, the lighting circuit 15 is disposed for each of a plurality of light emitting element arrays 7 to 9 having three columns.

Reference numerals 14-1, 14-2, . . . are lighting data (image signal) output lines, and lighting data are supplied thereto. Each of these output lines is branched to a plurality (branched to 3 according to the embodiment), and connected to a drain electrode of the TFT (second switching element) 16. The three branches of each of the lighting data output lines 14-1, 14-2, . . . are denoted by matrix addresses A22, A23, and A24 in positional relation for convenience.

A matrix selection gate wiring line 20 is connected to a gate electrode, and the TFT 16 selects a branched lighting data output, i.e., one of the matrix addresses A22, A23 and A24 according to a signal level of the matrix selection gate wiring line 20. A designated voltage that is lighting data is applied to a gate electrode of the TFT (third switching element) 17 via the TFT 16 corresponding to the selected matrix address. The TFT 17 is turned ON by the designated voltage, and charges corresponding to the designated voltage are held in the capacitance formation unit 18 formed between the gate and source electrodes of the TFT 17.

When receiving a power supply voltage Vdd to the drain electrode through a matrix supply power line 21 to be turned ON, the TFT 17 outputs a voltage to the source electrode side according to a potential applied to the gate electrode. This output voltage is supplied as a data potential to a data electrode of an organic EL light emitting element 4 via a column selection TFT 13. In this case, even if a signal level of the matrix selection gate wiring line 20 is set low to switch a matrix address to turn the TFT 16 OFF, lighting of the light emitting element 4 can be continued with designated brightness by a potential held in the capacitance formation unit 18.

By setting low a potential of matrix supply power Vdd supplied through the matrix supply power line 21 wired for each of the matrix addresses A22, A23, and A24 at desired timing, the light of the light emitting element 4 can be turned OFF at optional time. In other words, light emitting time of the light emitting element 4 can be controlled. Selected electrodes of the light emitting elements 4, 4, . . . are disposed in common for all the light emitting elements 4, 4, . . . of the light emitting element arrays 7 to 9, and formed by, for example, depositing aluminum or the like (transparent electrode of ITO or the like in the case of the top emission type) on a selected electrode formation unit 5. The selected electrode is connected to a selected electrode connection unit 6 formed on a selection takeout line 3.

Figure 16:
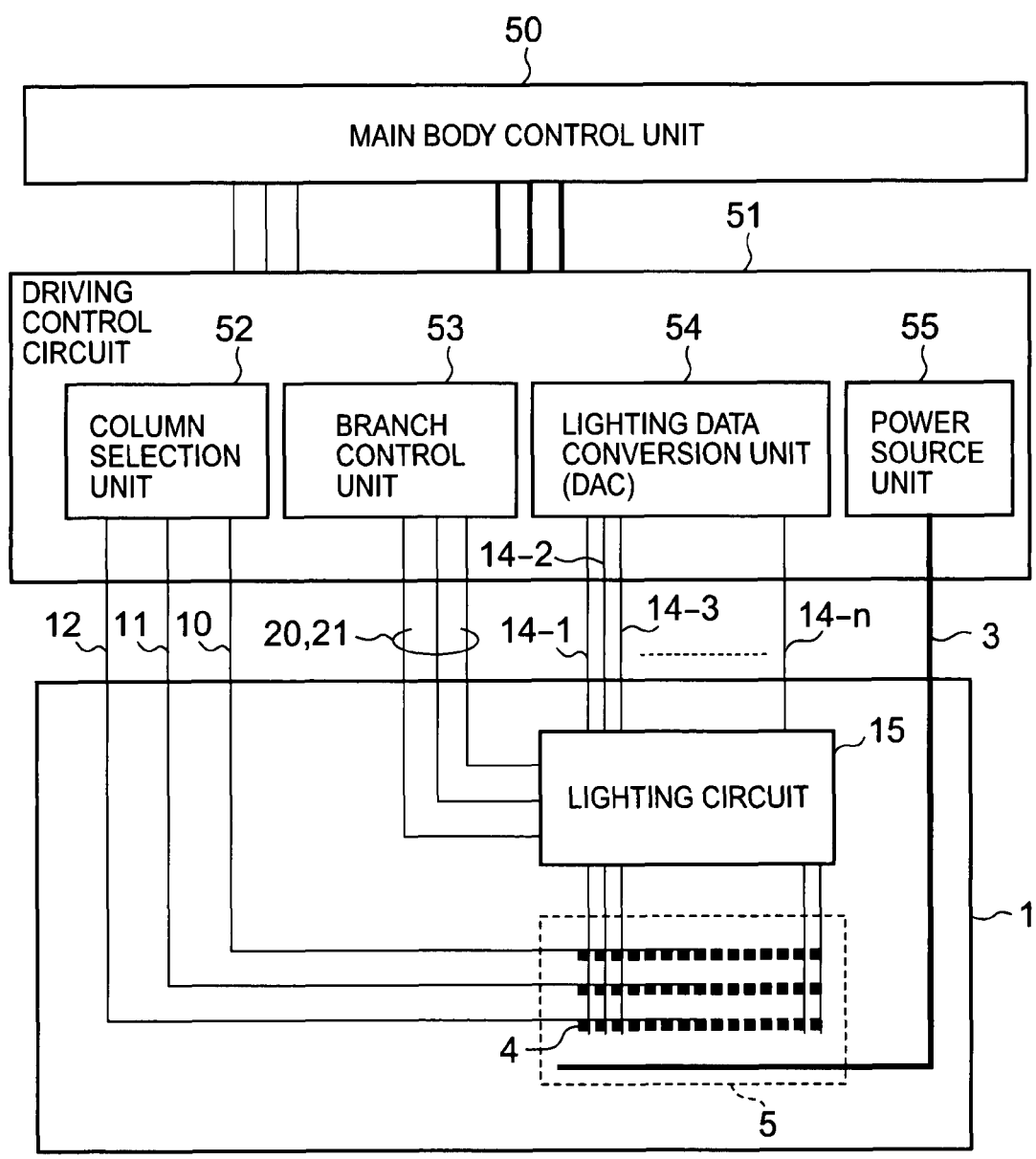
FIG. 16 is a block diagram showing a configuration of a controller of the exposure device of the second embodiment.

FIG. 16 is a block diagram showing a configuration of a controller of the exposure device of the second embodiment. As shown, a main body control circuit 50 generates lighting data (image signal) of the exposure device based on print image data to output the lighting data to a driving control unit 51, decides which column of the plurality of light emitting element arrays 7 to 9 on the light emitting element substrate 1 is used, and outputs a column selection signal for selecting the decided optional column to the driving control circuit 51.

Regarding which column of the plurality of light emitting elements 7 to 9 is used, predetermined switching conditions are set beforehand to prevent continuous use of the light emitting element array of the same column. When the switching conditions are established, the light emitting element array of a column unit to be used is switched. For the switching conditions, as in the case of the first embodiment, for example, the number of output pages, a life of an organic LED emission unit, a temperature increase, a reduction of an applied current, and an increase of an applied voltage may be used.

The driving control circuit 51 includes a column selection unit (column selection unit) 52, a branch control unit (division control circuit) 53, a lighting data conversion unit (driving signal output circuit) 54, and a power source unit 55. The column selection unit 52 drives turning ON/OFF of the column selection TFT 13 by a column selection signal via column selection gate wiring lines 10 to 12 of designated columns according to the column section signal based on the predetermined switching conditions from the main body control circuit 50. Thereby, one of the designated light emitting element arrays 7 to 9 can be optionally selected to be operated.

The branch control unit 53 controls turning ON/OFF of each TFT 16 via the matrix selection gate wiring line 20, selectively controls one of the branched lighting data outputs, i.e., the matrix addresses A22, A23, and A24, and controls supplying/nonsupplying of matrix supply power Vdd to the drain electrode of the TFT 17 via the matrix supply power line 21.

The lighting data conversion unit 54 includes, for example, a digital analog converter (DAC), and converts the lighting data from the main body control circuit 50 into analog signals (driving signals) for lighting the organic EL light emitting element to output the signals to the light emitting element substrate 1 via the lighting data output lines 14-1, 14-2, . . . 14-$n$. The lighting data conversion unit 54 includes n output terminals corresponding to the number of lighting data output lines 14-1, 14-2, . . . 14-$n$, and time-sequentially outputs lighting data corresponding to the branched matrix addresses A22, A23, and A24 from the output terminals. Selection timing of the matrix addresses A22, A23, and A24 is set to match time-sequential timing of the lighting data. The power source unit 55 sets the selection takeout line 3 to a predetermined potential.

Figure 17:
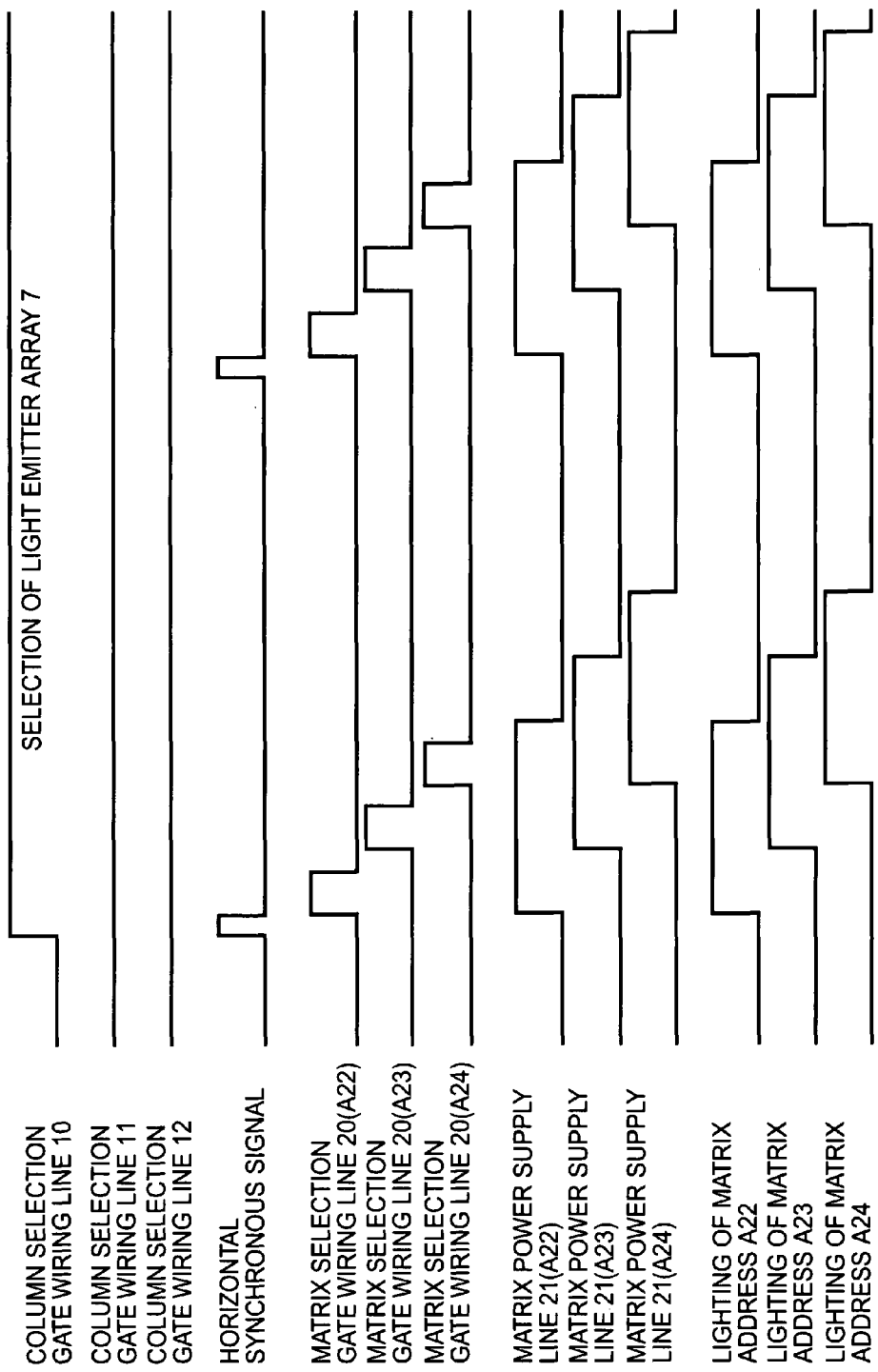
FIG. 17 is a timing chart showing an operation of the exposure device of the second embodiment.

FIG. 17 is a timing chart showing an operation of the exposure device of the second embodiment. The operation will be described below by setting the light emitting element arrays 7 to 9 respectively as "a" to "c" columns. The main body control circuit 50 decides which column of the plurality of light emitting element arrays 7 to 9 is used (e.g., "a" column) based on predetermined switching conditions, and supplies a selection signal for selecting the decided column to the driving control circuit 51. In other words, as shown in FIG. 17, for example, the column selection gate wiring line 10 is set to a high level, while the other selection gate wiring lines 11 and 12 are set to low levels. Accordingly, the light emitting element array 7 of the selected "a" column is selected.

Subsequently, the lighting data conversion unit 54 converts lighting data from the main body control circuit 50 into analog outputs for lighting the organic EL light emitting element by the analog digital converter (DAC), and time-sequentially outputs the lighting data corresponding to the matrix addresses A22, A23, and A24 to the light emitting element substrate 1 via the lighting data output lines 14-1, 14-2, . . . , 14-$n$.

The branch control unit 53 controls turning ON/OFF of the TFT 16 for selecting one of the matrix addresses A22, A23, and A24 via the matrix selection gate wiring line 20 by timing of time-sequentially supplying the lighting data corresponding to the matrix addresses A22, A23, and A24 to the lighting data output lines 14-1, 14-2, . . . 14-$n$, and controls supplying/nonsupplying of matrix supply power Vdd via the matrix supply power line 21. In other words, as shown in FIG. 17, by the timing of supplying the lighting data corresponding to the matrix address A22 to the lighting data output lines 14-1, 14-2, . . . 14-$n$, the matrix selection gate wiring line 20 (A22) corresponding to the matrix address A22 is set to a high level, and the matrix supply power line 21 (A22) corresponding to the matrix address A22 is set to a high level (power supply voltage Vdd).

As a result, in the light emitting element array 7 of the selected "a" column, the lighting data corresponding to the matrix address A22 are supplied to the light emitting elements 4, 4, . . . corresponding to the matrix address A22, lights are emitted with corresponding luminance. In this case, the other light emitting element arrays, i.e., the light emitting element arrays 8 and 9 of the "b" and "c" columns, are not used.

Then, at the branch control unit 53, as shown in FIG. 17, by the timing of supplying the lighting data corresponding to the matrix address A23 to the lighting data output lines 14-1, 14-2, . . . 14-$n$, the matrix selection gate wiring line 20 (A23) corresponding to the matrix address A23 is set to a high level, and the matrix supply power line 21 (A23) corresponding to the matrix address A23 is set to a high level (power supply voltage Vdd). As a result, in the light emitting element array 7 of the selected "a" column, the lighting data corresponding to the matrix address A23 are supplied to the light emitting elements 4, 4, . . . corresponding to the matrix address A23, lights are emitted with corresponding luminance. In this case, the other light emitting element arrays, i.e., the light emitting element arrays 8 and 9 of the "b" and "c" columns, are not used.

Similarly, at the branch control unit 53, as shown in FIG. 17, by the timing of supplying the lighting data corresponding to the matrix address A22 to the lighting data output lines 14-1, 14-2, . . . 14-$n$, the matrix selection gate wiring line 20 (A24) corresponding to the matrix address A24 is set to a high level, and the matrix supply power line 21 (A24) corresponding to the matrix address A24 is set to a high level (power supply voltage Vdd). As a result, in the light emitting element array 7 of the selected "a" column, the lighting data corresponding to the matrix address A24 are supplied to the light emitting elements 4, 4, . . . corresponding to the matrix address A24, lights are emitted with corresponding luminance. In this case, the other light emitting element arrays, i.e., the light emitting element arrays 8 and 9 of the "b" and "c" columns, are not used.

Thereafter, until switching conditions are established, in the light emitting element array 7 of the "a" column, the light emitting elements 4, 4, . . . respectively corresponding to the matrix addresses A22 to A24 sequentially emit lights.

Upon establishment of the switching conditions, the main body control circuit 50 decides which column of the plurality of light emitting element arrays 7 to 8 is used (e.g., "b" column), and supplies a selection signal for selecting the decided column to the driving control circuit 51. Then, by repeating the aforementioned operation, in the light emitting element array 7 of the "b" column, the light emitting elements 4, 4, . . . respectively corresponding to the matrix addresses A22 to A24 sequentially emit lights.

Upon establishment of the switching conditions, the main body control circuit 50 decides which column of the plurality of light emitting element arrays 7 to 8 is used (e.g., "c" column), and supplies a selection signal for selecting the decided column to the driving control circuit 51. Then, by repeating the aforementioned operation, in the light emitting element array 7 of the "c" column, the light emitting elements 4, 4, . . . respectively corresponding to the matrix addresses A22 to A24 sequentially emit lights. Thereafter, similarly, the light emitting element array is switched for each establishment of switching conditions.

According to the second embodiment, by forming the active matrix in the lighting circuit, the number which is a multiple of the number of output terminals of the light data conversion unit can be set to 1/plurality (e.g., ⅓) of the number of divided light emitting elements of one column of the light emitting element array, thereby reducing costs of the exposure device, and setting high duty of lighting time (prolonging lighting time of the organic EL emission unit). As a result, emission luminance of the light emitting element for obtaining desired exposure energy can be reduced, thereby prolonging the life of the light emitting element.

C. Third Embodiment

Figure 18:
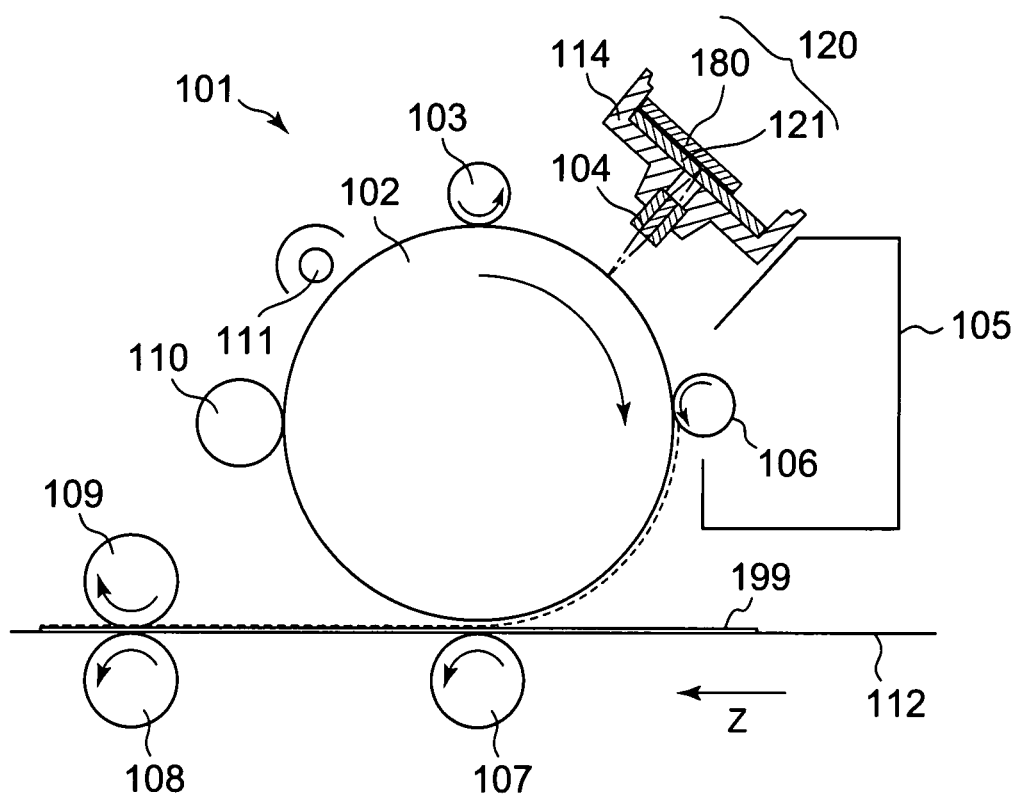
FIG. 18 is a schematic side view showing an image forming apparatus according to a third embodiment.

FIG. 18 is a schematic view showing an image forming apparatus 101 according to a third embodiment of the present invention.

The image forming apparatus 101 includes a photosensitive drum 102, a charge roller 103, an imaging optical system 104, a developing device 105, a develop roller 106, a transfer roller 107, fixing rollers 108 and 109, a cleaner 110, an eraser light source 111, a conveyor belt 112, an LSI chip 113, and an exposure panel 120.

The conveyor belt 112 is held between the photosensitive drum 102 and the transfer roller 107, and between the fixing rollers 108 and 109. By moving the conveyor belt 112 in an arrow direction Z, paper 199 set on the conveyor belt 112 is conveyed in the arrow direction Z. The paper 199 is a recording medium in which an image is formed by the image forming apparatus 101.

By forming an optical semiconductor layer in a peripheral surface of the photosensitive drum 102, charges are stored in the peripheral surface of the photosensitive drum 102, and the charges are removed by applying a light to the peripheral surface of the photosensitive drum 102. The charge roller 103 charges the peripheral surface of the photosensitive drum 102. The exposure panel 120 will be described below in detail. However, it should be noted here that by emitting a light from the exposure panel 120, a linear image parallel to an axial direction of the photosensitive drum 102 appears in the exposure panel 120. The imaging optical system 104 includes a rod lens (Glynn lens) arrayed along a bus of the photosensitive drum 102, and forms an image of the exposure panel 120 with erect equal magnification with respect to the photosensitive drum 102. In the exposure panel 120, the LSI chip 113 is connected to a film substrate. The exposure panel 120 and the imaging optical system 104 are mounted on a housing 114 to form a unit.

By exposing the photosensitive drum 102 along the bus through the exposure panel 120 and the imaging optical system 104, charges stored in the peripheral surface of the photosensitive drum 102 after charging are removed. An electrostatic latent image is formed along the bus of the photosensitive drum 102. In the developing device 105, colored fine particles called charged toner are stored. The develop roller 106 develops the electrostatic latent image formed in the photosensitive drum 102 after the exposure. That is, the toner adheres to the develop roller 106 in the developing device 105, and the toner of the develop roller 106 adheres to the photosensitive drum 102. No toner adheres to a charged portion (portion not irradiated with a light) of the photosensitive drum 102 because of repulsion, while the toner adheres to a discharged portion (portion irradiated with a light) of the photosensitive drum 102 to make the electrostatic latent image of the photosensitive drum 102 visible. The transfer roller 107 is pressed into contact with the photosensitive drum 102, and an image developed in the peripheral surface of the photosensitive drum 102 is transferred to the paper 199 held between the photosensitive drum 102 and the transfer roller 107. In other words, the paper 199 conveyed in the arrow direction Z is pressed to the photosensitive drum 102, and the transfer roller 107 is charged to attract the toner. As a result, the toner of the photosensitive drum 102 is adhered to the paper 199. The cleaner 110 removes toner left in the photosensitive drum 102 after the transfer. The fixing rollers 108 and 109 hold the paper 199 therebetween after the transfer to heat the paper 199. As a result, the toner electrostatically stuck to the paper 199 is fixed to the paper 199. The eraser light source 111 applies a light along the bus of the photosensitive drum 102 rotated after the toner removal to remove charges of the entire bus of the photosensitive drum 102.

Figure 19:
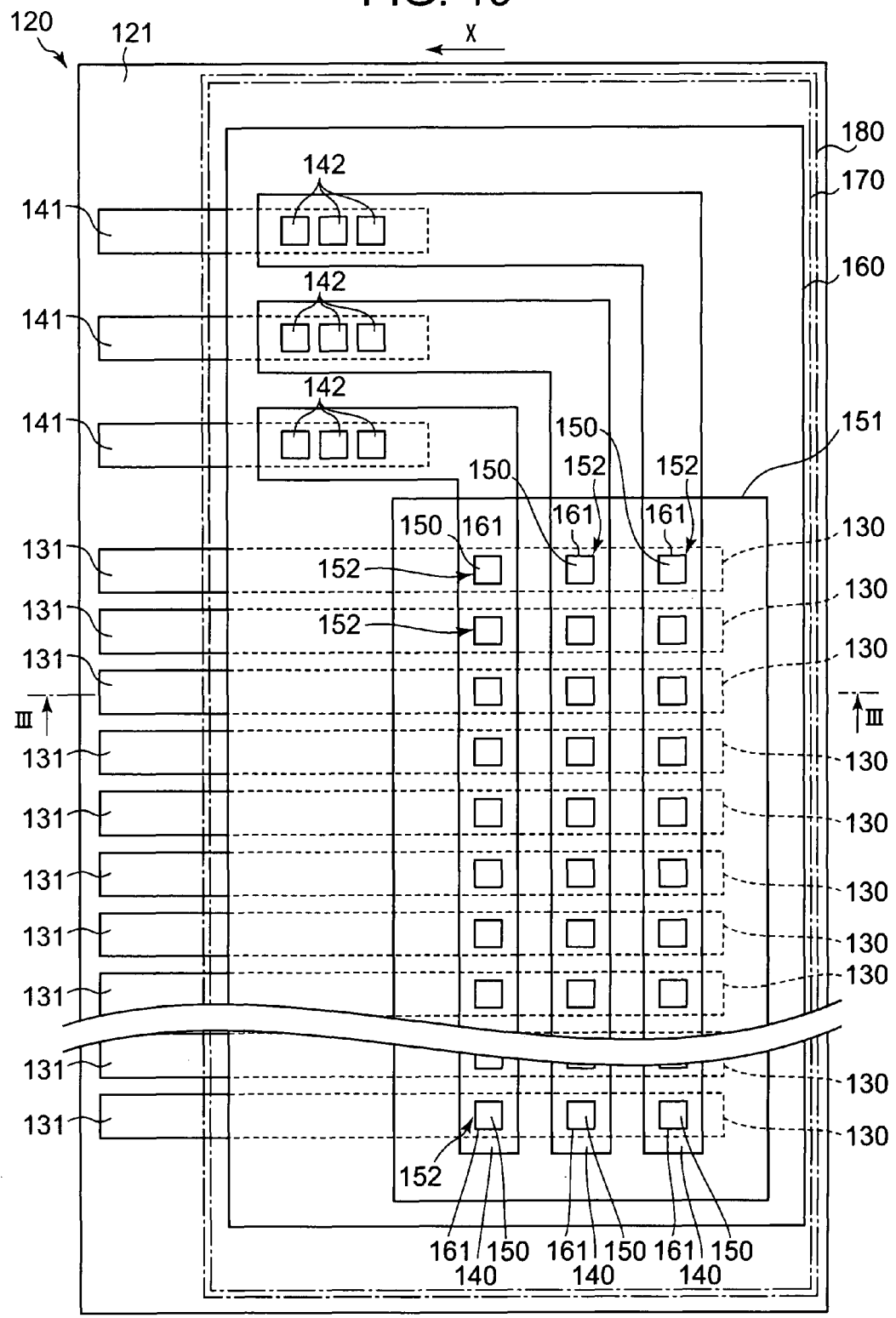
FIG. 19 is a plan view showing an exposure panel of the third embodiment.
Figure 20:
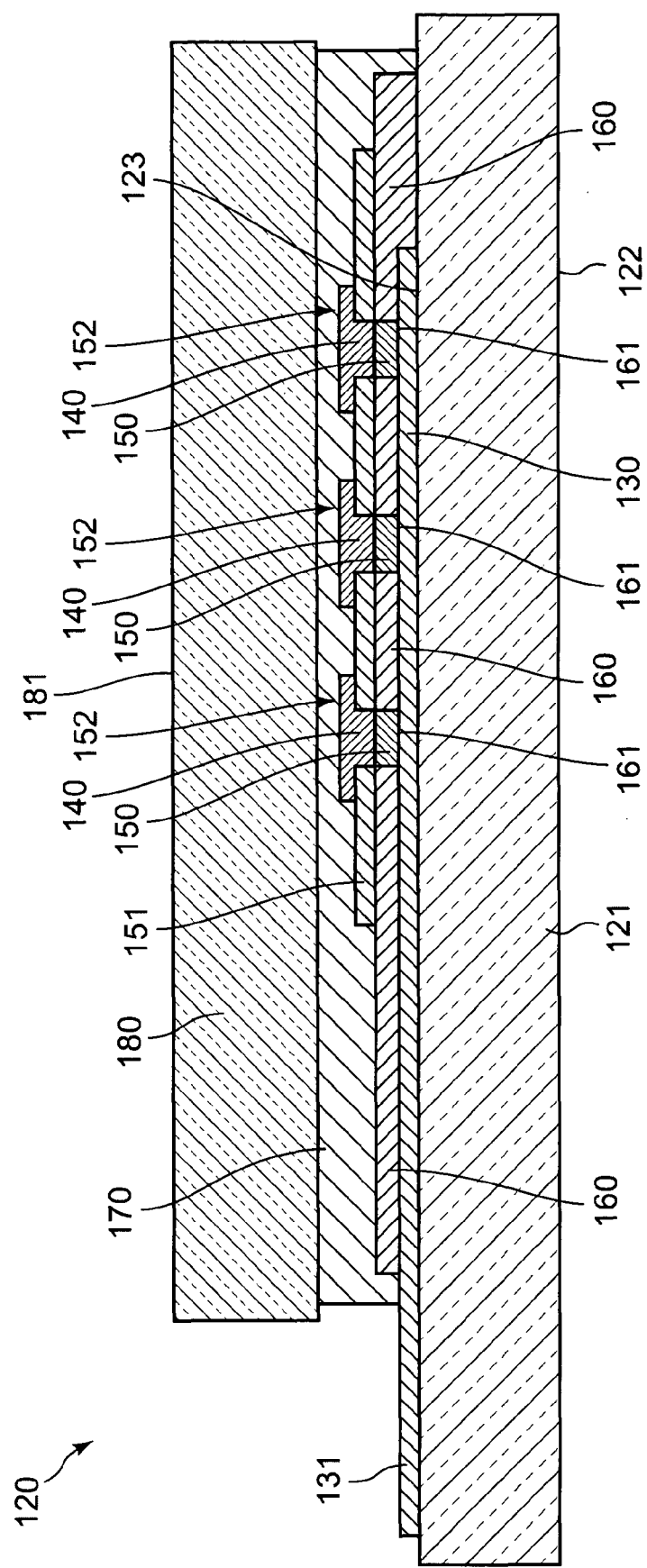
FIG. 20 is a sectional view of a surface cut along the line III-III of FIG. 19.

Referring to FIGS. 19 and 20, the exposure panel 120 will be described in detail. FIG. 19 is a plan view of the exposure panel 120, and FIG. 20 is a sectional view of a surface cut along the line III-III of FIG. 19.

A substrate 121 is made of a transparent material. The substrate 121 is, for example, a transparent glass substrate or a transparent resin substrate. One surface of the substrate 121 is an emission surface. The surface 122 is perpendicular to an optical axis of the imaging optical system 104, and becomes an object surface of the imaging optical system 104. The bus of the photosensitive drum 102 becomes an imaging surface of the imaging optical system 104.

A plurality of data electrodes 130 are formed in the other surface 123 of the substrate 121. The data electrodes 130 are transparent electrodes made of tin-doped indium oxides (ITO) or the like. The data electrodes 130 are disposed in a belt shape to extend in a row direction which is a moving direction X of the photosensitive drum 102 (direction perpendicular to an axis of the photosensitive drum 102). The data electrodes 130 are arrayed in a direction parallel to the axis of the photosensitive drum 102, i.e., a column direction, at equal spaces. The data electrodes 130 are electrodes to become anodes in pixels. The number of data electrodes 130 is 7000 to 15000.

On the substrate 121, an insulating film 160 which includes openings 161 formed in a plurality of places (3 places in the drawing) of each data electrode 130 is formed. In each data electrode 130, in one side along a column direction of the substrate 121, a terminal 131 of the data electrode 130 is exposed from the insulating film 160.

On the insulating film 160, a plurality of selected electrodes 140 are disposed over the plurality of openings 161 in the column direction to extend in a direction perpendicular to the axis of the photosensitive drum 102. Three selected electrodes 140 are arrayed at equal spaces in the extending direction of the data electrode 130. When seen from a plane, i.e., in the axial direction of the imaging optical system 104, the selected electrodes 140 are perpendicular to the data electrode 130. A place of intersection between the selected electrode 140 and the data electrode 130 becomes a light emitting element (organic EL element hereinafter) 152 such as an organic EL element described below. In the exposure panel 120, such organic EL elements 152 are arrayed in a matrix of 3 columns×7000 to 15000 rows.

Each selected electrode 140 includes a portion extending in the column direction and a portion extending in the row direction in one end of the portion of the column direction on the insulating film 160. In a tail end of the portion extending in the row direction, a plurality of contact holes 142 disposed in the insulating film 160 are buried.

A plurality of leader wiring lines 141 obtained by patterning the same transparent conductive film as that of the data electrode 130 are disposed by the same number as that of the selected electrodes 140 on the substrate 121. One end of each leader wiring line 141 is arranged in a position corresponding to the plurality of contact holes 142 disposed in the insulating film 160, and the other end is arranged in one side exposed from the insulating film 160 as in the case of the terminal 131 of the data electrode 130 in the column direction of the substrate 121. Accordingly, each selected electrode 140 is connected to the corresponding leader wiring line 141 via the plurality of contact holes 142.

The selected electrode 140 is made of a material lower in work function than the data electrode, for example, a single substance containing at least one of magnesium, calcium, lithium, barium, and a rare metal, or an alloy. The selected electrode 140 may have a laminated structure in which such various materials are stacked, or a laminated structure in which a metal layer of a higher work function is stacked in addition to such various materials. A specific example of the laminated structure is a structure in which a lower layer side of the selected electrode 140 is a highly pure barium or lithium layer of a low work function, and an upper layer side of the selected electrode 140 is a layer containing aluminum or an aluminum alloy of a high work function covering the barium or lithium layer. The selected electrode 140 is an electrode to become a cathode in each pixel. In the drawing, the number of selected electrodes 140 is 3. However, the number thereof may be 2, or 4 or more.

When seen from a plane, an opening 161 of the insulating film 160 is formed in each intersection between the data electrode 130 and the selected electrode 140 on the insulating film 160. An EL layer 150 is buried in the opening 161, and the EL layer 150 is held between the data electrode 130 and the selected electrode 140 to form an organic EL element 152.

The EL layer 150 contains a light emitting material (fluorescent material) which is an organic compound. The light emitting material may be a high molecular material or a low molecular material. The layer 150 may be a single layer, or has a laminated structure of a plurality of layers. When the EL layer 150 has a laminated structure, while there are no restrictions, a three-layer structure which includes a hole transport layer, a light emitting layer and an electron transport layer in order from the lower side, a double-layer structure which includes a hole transport layer and a light emitting layer in order from the lower side, or a structure which includes an electron or hole injection layer between proper layers in such a layer structure may be employed.

The EL layer 150 emits a light when the data electrode 130 of the lower layer is set to a potential higher than that of the selected electrode 140 of the upper layer, and electrons and holes are transported therein. Emission intensity of the EL layer 150 correlates with a flowing current.

A residual layer 151 is formed around the opening 161 on the insulating film 160. The residual layer 151 is not held between the data electrode 130 and the selected electrode 140, or no light is emitted because of no interposition of the insulating film 160. However, components are similar to those of the EL layer 150. Simultaneously when the residual layer 151 is coated to be formed in the insulating film 160 having the opening 161, the EL layer 150 is buried in each opening 161, and the EL layers 150 are patterned in a matrix shape. The residual layer 150 may be continuous or discontinuous from the EL layer 150. When an organic compound containing liquid (prepared by dissolving a raw material of the EL layer 150 in a solvent) is discharged as a droplet to each opening 161 by an ink jet method (droplet discharge method) to pattern each EL layer 150, no residual layer 151 is formed.

The residual layer 151 and the plurality of selected electrodes 140 are covered with a sealant 170 containing at least one of an inorganic material or an organic material for sealing water and oxygen, and a sealing plate 180 is put to cover the sealant 170.

A surface 122 of the substrate 121 faces an incident part of the imaging optical system 104. However, a surface 181 of the sealing plate 180 of the opposite side may face the incident part of the imaging optical system 104. In this case, the selected electrode 140, the sealing 170, and the sealing plate 180 are transparent, and a surface 181 of the sealing plate 180 becomes an emission surface. The entire selected electrode 140 can be made transparent by thinly depositing a material of a low work function with 1 to 10 nm, and then depositing a transparent conductive film of ITO or the like with 50 nm or more. In this case, a structure may be employed in which the data electrode 130 preferably contains a reflective conductive film, and a transparent conductive film of ITO or the like is formed on a layer containing light reflective aluminum or aluminum alloy.

The data electrode 130 is an anode, and the selected electrode 140 is a cathode. Conversely, however, the data electrode 130 may be a cathode, and the selected electrode 140 may be an anode.

As described above, the exposure panel has a simple structure which includes the plurality of data electrodes 130, the plurality of selected electrodes 140, the plurality of EL layers 150, and the like, and no complex circuit is patterned in the exposure panel 120. Thus, the exposure panel 120 can be provided inexpensively at low manufacturing costs.

Next, a manufacturing method of the exposure panel 120 will be described.

A transparent conductive thin film (e.g. ITO film) is formed in a surface 123 of the substrate 121, and the thin film is shaped by a photolithography/etching method. Accordingly, a plurality of data electrodes 130 and a plurality of leader wiring lines 141 are formed. Then, a resist is removed.

An insulating film 160 is formed in a state of being masked by the photolithography method using a CVD device or the like. Then, the mask is removed. A plurality of contact holes 142 and a plurality of openings 161 are formed in the insulating film 161. Along each data electrode 130, a plurality of openings 161 are formed on each data electrode 130, the openings 161 which is equal in number to that of selected electrodes 140 are arrayed in a row, and the plurality of openings 161 are arranged in a matrix as whole. Thus, the number of openings 161 is a product of the numbers of data electrodes 130 and selected electrodes 140.

A metal mask is put over the insulating film 160, an EL layer 150 made of a low molecular light emitting material is buried in the opening 161 by stacking a low molecular light emitting material in an opening of the metal mask, and a residual layer 151 is formed on the insulating film 160. Then, the metal mask is removed. If an organic compound containing liquid is discharged as a droplet to each opening 161 using an ink jet method (droplet discharging method), the necessity of burying the EL layer 150 in each opening 161 and forming the residual layer 151 is eliminated.

Through deposition using the metal mask (including openings corresponding to the plurality of selected electrodes 140), for example, the plurality of selected electrodes 140 prepared by forming films of low work functions such as magnesium and then forming aluminum alloys are patterned in a separated state, and then the metal mask is removed.

A sealant 170 and a sealing plate 180 are put over the selected electrodes 140, the residual layers 151, and the insulating films 160 to seal them. A LSI chip 113 is connected to the substrate 121 from above the terminal 131 and the leader wiring line 141 through a film substrate (not shown). As a result, a terminal of the LSI chip 113 is connected to the terminal 131 and the leader wiring line 141. The LSI chip 113 may be coupled chip on glass (COG) on the substrate 121.

The exposure panel 120 is mounted on the housing 114, and the imaging optical system 104 is also mounted to face the imaging optical system 104 and exposure panel 120 to each other.

Figure 21:
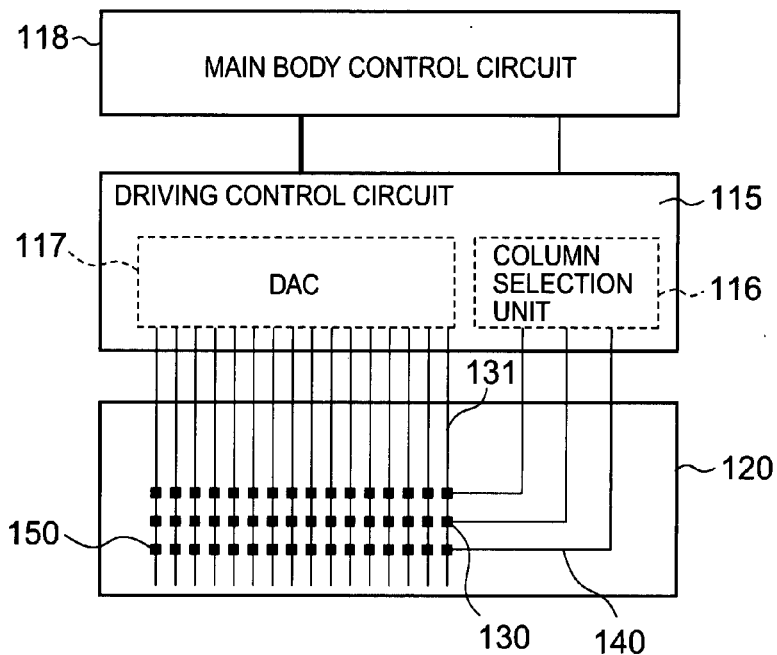
FIG. 21 is a block diagram showing a circuit disposed in the image forming apparatus.

Next, referring to FIG. 21, the LSI chip 113 will be described.

The LSI chip 113 incorporates a driving control circuit 115, and the driving control circuit 115 includes a DAC 117 and a column selection unit 116. A main body control circuit 118 is connected to the driving control circuit 115, and the driving control circuit 115 is controlled by a signal from the main body control circuit 118.

The main body control circuit 118 generates gradation data signals of pixels based on print image data, and sequentially outputs the gradation data signals to the driving control circuit 115. The main body control circuit 118 outputs a control signal such as a clock signal for selecting one of the plurality of selected electrodes 140 to the driving control circuit 115.

The driving control circuit 115 carries out the digital analog conversion for the sequentially input gradation data by the DAC 117, and outputs light emitting signals according to the gradation data to the data electrodes 130 at a predetermined timing. The gradation data may be indicated by the amount of a current or a voltage. An output of the DAC 117 may be a constant current output or a constant voltage output.

The driving control circuit 115 changes voltages of the plurality of selected electrodes 140 based on the control signal input from the main body control circuit 118 by the column selection unit 116 to cause flowing of a current through a selected electrode 140 which is designated (the selected electrode 140 which is designated will be referred to as a designated selected electrode 140, and the other selected electrodes 140 which are not designated will be referred to as undesignated selected electrodes 140 hereinafter). In this case, the driving control circuit 115 designates a designated selected electrode 140 by varying a voltage applied to the designated selected electrode 140 of the plurality of selected electrodes 140 from that applied to the other undesignated selected electrode 140.

Figure 22:
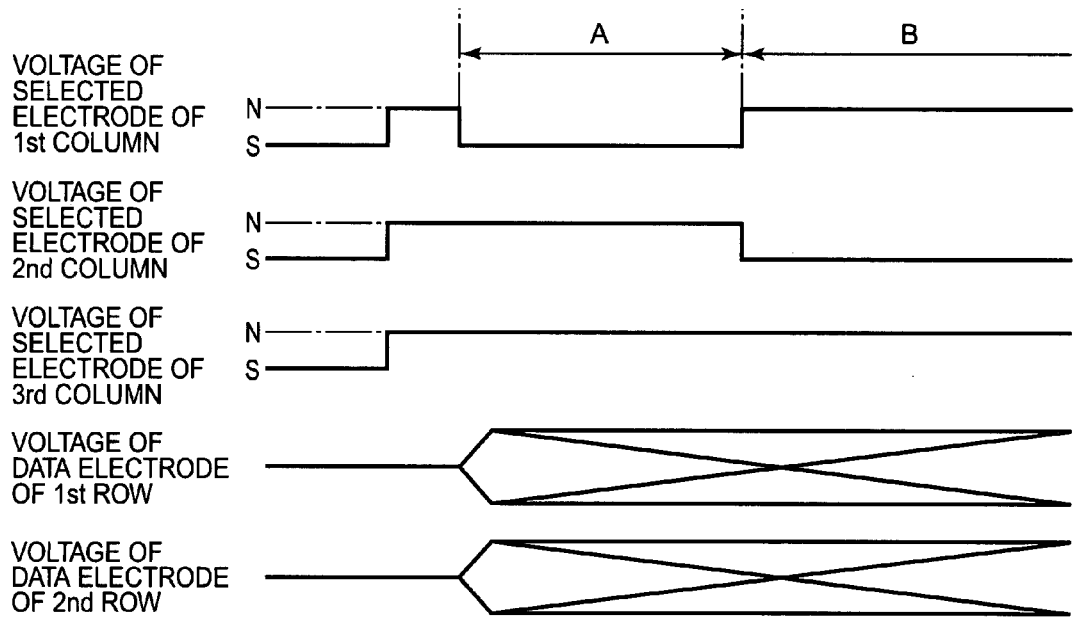
FIG. 22 is a timing chart of a voltage applied to designate selected electrode.

Specifically, if the plurality of selected electrodes 140 are cathodes, a selected voltage S of low potential (e.g., ground potential) is applied to one designated selected electrode 140 of the plurality of selected electrodes 140 to designate the designated selected electrode 140. The unselected voltages N relatively higher than the selected voltage S are applied to the other undesignated selected electrodes 140 not to designate the undesignated selected electrodes 140. Accordingly, when a light emitting signal is applied to each data electrode 130, a voltage exceeding a light emission threshold value is applied to the EL layer 150 between the data electrode 130 and the designated selected electrode 140 to cause current flowing and to emit a light. However, no light is emitted because a voltage of the EL layer 150 disposed near a point of intersection between the undesignated selected electrode 140 and each data electrode 130 does not exceed the light emission threshold value. For example, FIG. 22 is a timing chart showing voltages applied to the selected electrodes 140 when the number of selected electrodes 140 is 3. In FIG. 21, in a designated period A, a voltage of a selected electrode 140 of a 1st column is a selected voltage S. Accordingly, the selected electrode 140 of the 1st column is designated, and the EL layer 150 disposed near a point of intersection between the selected electrode 140 of the 1st column and each data electrode 130 emits a light. In a designated period B, because a voltage of a selected electrode 140 of a 2nd column is a selected voltage S, the selected electrode 140 of the 2nd column is designated.

On the other hand, if the plurality of selected electrodes 140 are anodes, a selected voltage S of a designated selected electrode 140 of the plurality of selected electrodes 140 is a high voltage, and unselected voltages N relatively lower than the selected voltage S are applied to the other undesignated selected electrodes 140. The selected voltage S is a voltage in which a voltage exceeding the light emission threshold value is generated in the EL layer 150 between the designated selected electrode 140 and the data electrode 130, and the unselected voltage N is a voltage in which a voltage (e.g., 0V) not exceeding the light emission threshold value is generated in the EL layer 150 between the undesignated selected electrode 140 and the data electrode 130.

In the exposure panel 120, in the EL layer 150 superposed in the designated selected electrode 140, if emission luminance is greatly reduced when a predetermined voltage is applied, by designating the other selected electrode 140, the EL layer 150 disposed near a point of intersection between the selected electrode 140 and each data 130 emits a light. Thus, by providing the column selection unit for switching the selected electrode 140 to be designated, a life of the exposure panel 120 can be prolonged. Even if a light emission failure occurs in the EL layer 150, exposure can be carried out by designating not the selected electrode 140 of the failed EL layer 150 but the other selected electrode. Thus, a yield ratio of the exposure panel 120 can be increased. To prevent deterioration caused by heat generated in the EL layer 150 by continuous light emission, division may be employed to avoid long continuance of designation of the same selected electrode 140. An optical sensor for detecting a reduction in emission luminance or a light emission failure may be disposed in the image forming apparatus 101.

Next, operation methods of the image forming apparatus 1 and the exposure panel 120 will be described. There are six types of operation methods, and each will be described.

(1) First Operation Method

A first operation method is a method for switching the designated selected electrode 140 for each print page.

First, one selected electrode 140 (e.g., selected electrode 140 of a 1st column) is designated among the plurality of selected electrodes 140 by the column selection unit 116 of the driving control circuit 115, the designated selected electrode 140 is designated until an image of a piece of paper 199 is finished, and the organic EL element 152 of the designated selected electrode 140 continuously emits a light only by one page. The photosensitive drum 102, the charge roller 103, the develop roller 106, the transfer roller 107, and the fixing rollers 108 and 109 are rotated, the eraser light source 111 emits a light, and the paper 199 is conveyed on the conveyor belt 112. The driving control circuit 115 sequentially carries out the digital analog conversion for the sequentially input gradation data by the DAC 117, and outputs light emitting signals to the data electrodes 130. Accordingly, the EL layer 150 disposed near a point of intersection between the designated selected electrode 140 and each data electrode 130 emits a light with intensity according to the gradation data. Thus, images are formed in the paper 199. After the image forming executed on the paper 199 is ended, the designated selected electrode 140 is switched and, for example, the period is changed from the designated period A to the designated period B in FIG. 22. In other words, after the image forming executed on the paper 199 is ended, another selected electrode 140 (e.g., selected electrode 140 of a 2nd column) is designated among the plurality of selected electrodes 140 by the column selection unit 116 of the driving control circuit 115, and images are formed in next paper 199. In this case, only one light emitted from one organic EL element 152 between the data electrode 130 and the designated selected electrode 140 (or no light is emitted once) is applied to 1 dot of a minimum unit of a latent image during one rotation of the photosensitive drum 102, i.e., 1 dot of a minimum unit printed in the paper 199, and no multiple exposure is carried out by 1 dot. When there are 3 columns of selected electrodes 140, the 1st, the 2nd, the 3rd, the 1st, 2nd, . . . are sequentially switched. In other words, when there are N columns (N is an integer of 2 or more) of selected electrodes 140, the organic EL element 152 corresponding to the selected electrode 140 of an i-th column ($1 \leq i \leq N$) can pause without emitting a light for a designated period of (N−1) columns, which is a designated period of the selected electrode 140 of an (i+1)-th column, a designated period of the selected electrode 140 of an (i+2)-th column, . . . , and a period of the selected electrode 140 of an (i−1)-th column after the end of designation.

By switching designation for each paper 199, even if printing is continuously carried out, overheating of the organic EL element 152 is prevented. As a result, the life of the exposure panel 120 can be prolonged.

(2) Second Operation Method

A second operation method is a method for switching the designated selected electrode 140 for each predetermined number of print pages by a page counter.

First, one selected electrode 140 is designated among the plurality of selected electrodes 140 by the column selection unit 116 of the driving control circuit 115, and the designation of the designated selected electrode 140 is continued until images of a predetermined number of pieces of paper 199 are finished. The photosensitive drum 102, the charge roller 103, the develop roller 106, the transfer roller 107, and the fixing rollers 108 and 109 are rotated, the eraser light source 111 emits a light, and the paper 199 is conveyed on the conveyor belt 112. The driving control circuit 115 sequentially carries out the digital analog conversion for the sequentially input gradation data by the DAC 117, and outputs gradation data to the data electrodes 130. Accordingly, the EL layer 150 disposed near a point of intersection between the designated selected electrode 140 and each data electrode 130 emits a light with intensity according to the gradation data. Thus, images are formed in the paper 199. After the image forming executed on the paper 199 is ended, next paper 199 is conveyed on conveyor belt 112, and then image forming is repeated. After the image forming executed on the predetermined number of pieces of paper 199 is ended, the designated selected electrode 140 is switched and, for example, the period is changed from the designated period A to the designated period B in FIG. 22. In other words, after the image forming executed on the predetermined number of pieces of paper 199 is ended, another selected electrode 140 is designated among the plurality of selected electrodes 140 by the column selection unit 116 of the driving control circuit 115, and images are formed in the predetermined number of pieces of paper 199. The image forming executed on the predetermined number of pieces of paper 199 may be carried out continuously, or intermittently. The number of pieces of paper 199 in which images are formed is counted by a counter.

The predetermined number of pieces of paper may be an estimated life reaching number of pieces. In other words, the estimated number of pieces of paper in which the EL layer 150 reaches its life may be set as a predetermined number of pieces. In this case, only one light emitted from one organic EL element 152 between the data electrode 130 and the designated selected electrode 140 (or no light is emitted once) is applied to 1 dot of a minimum unit of a latent image during one rotation of the photosensitive drum 102, i.e., 1 dot of a minimum unit printed in the paper 199, and no multiple exposure is carried out by 1 dot. When there are 3 columns of selected electrodes 140, the 1st, the 2nd, the 3rd, the 1st, 2nd, . . . are sequentially switched. In other words, when there are N columns (N is an integer of 2 or more) of selected electrodes 140, the organic EL element 152 corresponding to the selected electrode 140 of an i-th column ($1 \leq i \leq N$) can pause without emitting a light for a designated period of (N−1) columns, which is a designated period of the selected electrode 140 of an (i+1)-th column, a designated period of the selected electrode 140 of an (i+2)-th column, . . . , and a period of the selected electrode 140 of an (i−1)-th column after the end of designation.

(3) Third Operation Method

A third operation method is a method for switching the designated selected electrode 140 when images are formed on the predetermined number of pieces of paper within predetermined time.

First, one selected electrode 140 is designated among the plurality of selected electrodes 140 by the column selection unit 116 of the driving control circuit 115, and the designation of the designated selected electrode 140 is continued until images of the predetermined number of pieces of paper 199 are finished within predetermined time. The photosensitive drum 102, the charge roller 103, the develop roller 106, the transfer roller 107, and the fixing rollers 108 and 109 are rotated, the eraser light source 111 emits a light, and the paper 199 is conveyed on the conveyor belt 112. The driving control circuit 115 sequentially carries out the digital analog conversion for the sequentially input gradation data by the DAC 117, and outputs gradation data to the data electrodes 130. Accordingly, the EL layer 150 disposed near a point of intersection between the designated selected electrode 140 and each data electrode 130 emits a light with intensity according to the gradation data. Thus, images are formed in the paper 199. After the image forming executed on the paper 199 is ended, next paper 199 is conveyed on the conveyor belt 112, and then image forming is repeated. When image forming is finished in the predetermined number of pieces of paper within the predetermined time, the designated selected electrode 140 is switched and, for example, the period is changed from the designated period A to the designated period B in FIG. 22. In other words, after the image forming executed on the predetermined number of pieces of paper 199 within the predetermined time is ended, another selected electrode 140 is designated among the plurality of selected electrodes 140 by the column selection unit 116 of the driving control circuit 115, and images are formed in a next predetermined number of pieces of paper 199. In this case, only one light emitted from one organic EL element 152 between the data electrode 130 and the designated selected electrode 140 (or no light is emitted once) is applied to 1 dot of a minimum unit of a latent image during one rotation of the photosensitive drum 102, i.e., 1 dot of a minimum unit printed in the paper 199, and no multiple exposure is carried out by 1 dot. When there are 3 columns of selected electrodes 140, the 1st, the 2nd, the 3rd, the 1st, 2nd, . . . are sequentially switched. In other words, when there are N columns (N is an integer of 2 or more) of selected electrodes 140, the organic EL element 152 corresponding to the selected electrode 140 of an i-th column ($1 \leq i \leq N$) can pause without emitting a light for a designated period of (N−1) columns, which is a designated period of the selected electrode 140 of an (i+1)-th column, a designated period of the selected electrode 140 of an (i+2)-th column, . . . , and a period of the selected electrode 140 of an (i−1)-th column after the end of designation.

(4) Fourth Operation Method

A fourth operation method is a method for switching the designated selected electrode 140 when the EL layer 150 staked on the designated selected electrode 140 reaches a predetermined temperature. A temperature sensor is provided for measuring a temperature of the organic EL element 152.

First, one selected electrode 140 is designated among the plurality of selected electrodes 140 by the column selection unit 116 of the driving control circuit 115. The photosensitive drum 102, the charge roller 103, the develop roller 106, the transfer roller 107, and the fixing rollers 108 and 109 are rotated, the eraser light source 111 emits a light, and the paper 199 is conveyed on the conveyor belt 112. The driving control circuit 115 sequentially carries out the digital analog conversion for the sequentially input gradation data by the DAC 117, and outputs gradation data to the data electrodes 130. Accordingly, the EL layer 150 disposed near a point of intersection between the designated selected electrode 140 and each data electrode 130 emits a light with intensity according to the gradation data. Thus, images are formed in the paper 199. After the image forming executed on the paper 199 is ended, next paper 199 is conveyed on the conveyor belt 112, and image forming is repeated. During the image forming, when the temperature sensor detects reaching of a predetermined temperature by a light emitted from the EL layer stacked on the designated selected electrode 140, the designated selected electrode 140 is switched and, for example, the period is changed from the designated period A to the designated period B in FIG. 22. In other words, when the EL layer 150 stacked on the designated selected electrode 140 reaches the predetermined temperature or more, another selected electrode 140 is designated among the plurality of selected electrodes 140 by the column selection unit 116 of the driving control circuit 115, and images are formed. In this case, only one light emitted from one organic EL element 152 between the data electrode 130 and the designated selected electrode 140 (or no light is emitted once) is applied to 1 dot of a minimum unit of a latent image during one rotation of the photosensitive drum 102, i.e., 1 dot of a minimum unit printed in the paper 199, and no multiple exposure is carried out by 1 dot. When there are 3 columns of selected electrodes 140, the 1st, the 2nd, the 3rd, the 1st, 2nd, . . . are sequentially switched. In other words, when there are N columns (N is an integer of 2 or more) of selected electrodes 140, the organic EL element 152 corresponding to the selected electrode 140 of an i-th column ($1 \leq i \leq N$) can pause without emitting a light for a designated period of (N−1) columns, which is a designated period of the selected electrode 140 of an (i+1)-th column, a designated period of the selected electrode 140 of an (i+2)-th column, . . . , and a period of the selected electrode 140 of an (i−1)-th column after the end of designation.

(5) Fifth Operation Method

A fifth operation method is a method for switching the designated selected electrode 140 when an applied current is reduced to a predetermined threshold value during constant voltage driving. In the image forming apparatus 101, an ammeter for detecting a current flowing through the organic EL element 152 is connected to a wiring line connected to the terminal 31.

First, one selected electrode 140 is designated among the plurality of selected electrodes 140 by the column selection unit 116 of the driving control circuit 115. The photosensitive drum 102, the charge roller 103, the develop roller 106, the transfer roller 107, and the fixing rollers 108 and 109 are rotated, the eraser light source 111 emits a light, and the paper 199 is conveyed on the conveyor belt 112. The driving control circuit 115 sequentially carries out the digital analog conversion for the sequentially input gradation data by the DAC 117, and outputs gradation data to the data electrodes 130. Accordingly, the EL layer 150 disposed near a point of intersection between the designated selected electrode 140 and each data electrode 130 emits a light with intensity according to the gradation data. Thus, images are formed in the paper 199. After the image forming executed on the paper 199 is ended, next paper 199 is conveyed on the conveyor belt 112, and image forming is repeated. During the image forming, if an output of the DAC 17 is a constant voltage output, the ammeter reads an applied current of the DAC 17. Upon detection that one of values of currents flowing through the plurality of organic EL elements 152 corresponding to the designated selected electrode 140 has been reduced to a predetermined threshold value, deterioration of the organic EL element 152 is determined to switch the designated selected electrode 140 and, for example, the period is changed from the designated period A to the designated period B in FIG. 22. When an applied current is reduced to the predetermined threshold value, another selected electrode 140 is designated among the plurality of selected electrodes 140 by the column selection unit 116 of the driving control circuit 115. In this case, only one light emitted from one organic EL element 152 between the data electrode 130 and the designated selected electrode 140 (or no light is emitted once) is applied to 1 dot of a minimum unit of a latent image during one rotation of the photosensitive drum 102, i.e., 1 dot of a minimum unit printed in the paper 199, and no multiple exposure is carried out by 1 dot. When there are 3 columns of selected electrodes 140, the 1st, the 2nd, the 3rd, the 1st, 2nd, . . . are sequentially switched. In other words, when there are N columns (N is an integer of 2 or more) of selected electrodes 140, the organic EL element 152 corresponding to the selected electrode 140 of an i-th column ($1 \leq i \leq N$) can pause without emitting a light for a designated period of (N−1) columns, which is a designated period of the selected electrode 140 of an (i+1)-th column, a designated period of the selected electrode 140 of an (i+2)-th column, . . . , and a period of the selected electrode 140 of an (i−1)-th column after the end of designation.

(6) Sixth Operation Method

A sixth operation method is a method for switching the designated selected electrode 140 when an applied voltage is increased to a predetermined threshold value during constant current driving. In the image forming apparatus 101, a voltmeter for detecting a voltage applied to the organic EL element 152 is connected to a wiring line connected to the leader wiring line 141 and to a wiring line connected to the terminal 31.

First, one selected electrode 140 is designated among the plurality of selected electrodes 140 by the column selection unit 116 of the driving control circuit 115. The photosensitive drum 102, the charge roller 103, the develop roller 106, the transfer roller 107, and the fixing rollers 108 and 109 are rotated, the eraser light source 111 emits a light, and the paper 199 is conveyed on the conveyor belt 112. The driving control circuit 115 sequentially carries out the digital analog conversion for the sequentially input gradation data by the DAC 117, and outputs gradation data to the data electrodes 130. Accordingly, the EL layer 150 disposed near a point of intersection between the designated selected electrode 140 and each data electrode 130 emits a light with intensity according to the gradation data. Thus, images are formed in the paper 199. After the image forming executed on the paper 199 is ended, next paper 199 is conveyed on the conveyor belt 112, and image forming is repeated. During the image forming, if an output of the DAC 17 is a constant current output, voltages applied to the plurality of organic EL elements 152 corresponding to the designated selected electrode 140 are read. When one of the voltages increases to a predetermined threshold value, deterioration of the organic EL element 152 is determined to switch the designated selected electrode 140 and, for example, the period is changed from the designated period A to the designated period B in FIG. 22. In other words, the voltage applied to the organic EL element 152 reaches the predetermined threshold value to set high resistance, another selected electrode 140 is designated among the plurality of selected electrodes 140 by the column selection unit 116 of the driving control circuit 115. In this case, only one light emitted from one organic EL element 152 between the data electrode 130 and the designated selected electrode 140 (or no light is emitted once) is applied to 1 dot of a minimum unit of a latent image during one rotation of the photosensitive drum 102, i.e., 1 dot of a minimum unit printed in the paper 199, and no multiple exposure is carried out by 1 dot. When there are 3 columns of selected electrodes 140, the 1st, the 2nd, the 3rd, the 1st, 2nd, . . . are sequentially switched. In other words, when there are N columns (N is an integer of 2 or more) of selected electrodes 140, the organic EL element 152 corresponding to the selected electrode 140 of an i-th column ($1 \leq i \leq N$) can pause without emitting a light for a designated period of (N−1) columns, which is a designated period of the selected electrode 140 of an (i+1)-th column, a designated period of the selected electrode 140 of an (i+2)-th column, . . . , and a period of the selected electrode 140 of an (i−1)-th column after the end of designation.

D. Fourth Embodiment

Figure 23:
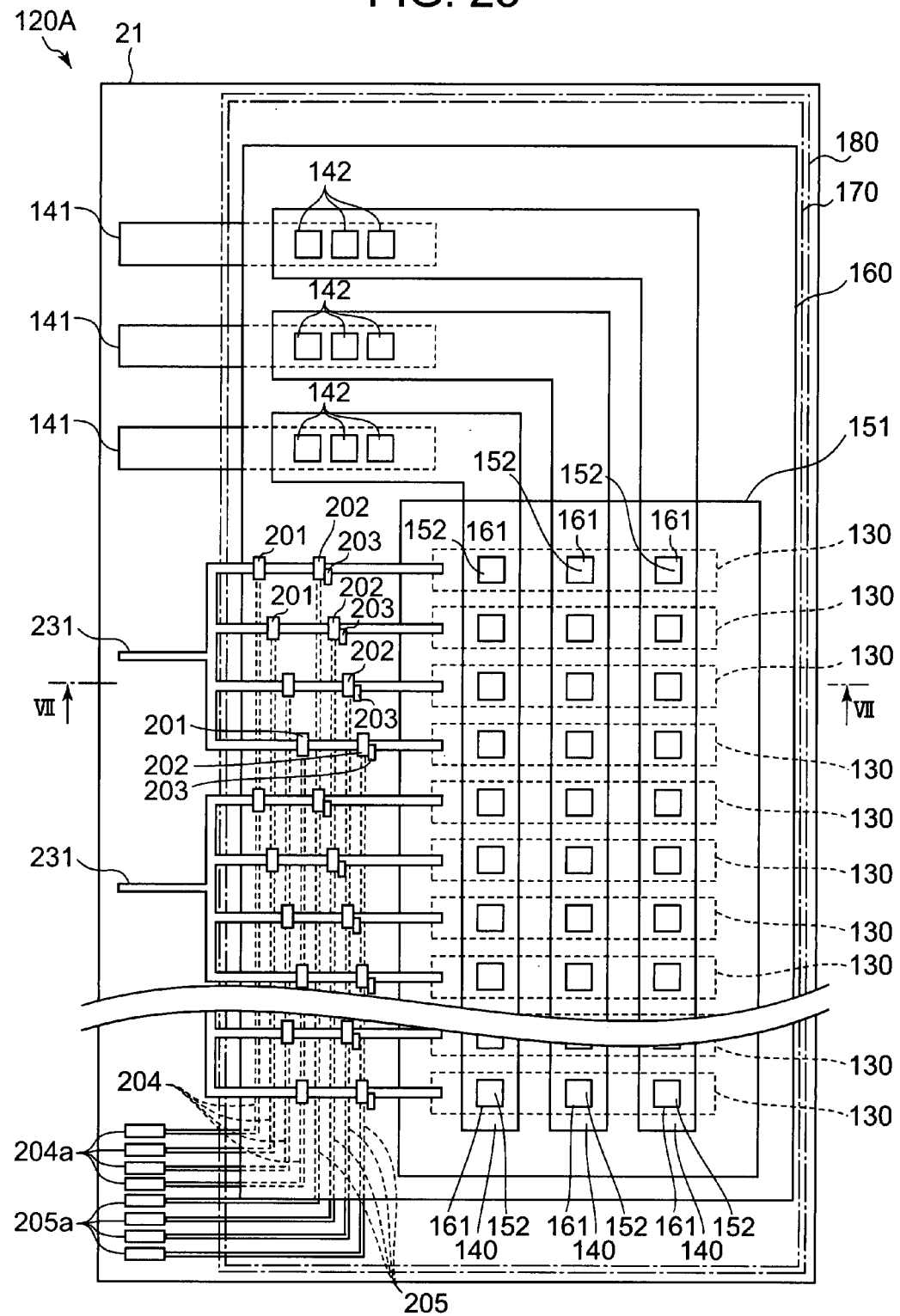
FIG. 23 is a plan view showing an exposure panel according to a fourth embodiment.
Figure 24:
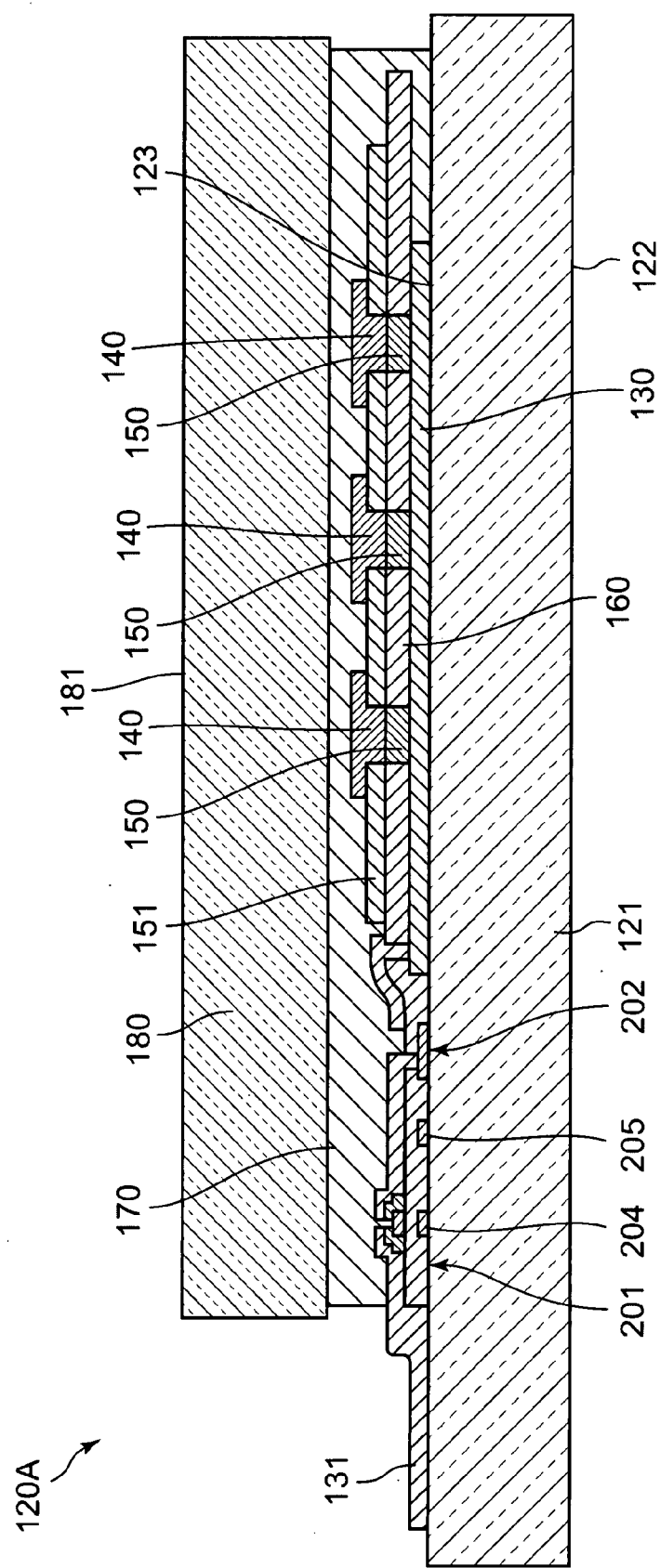
FIG. 24 is a sectional view of a surface cut along the line VII-VII of FIG. 23.
Figure 25:
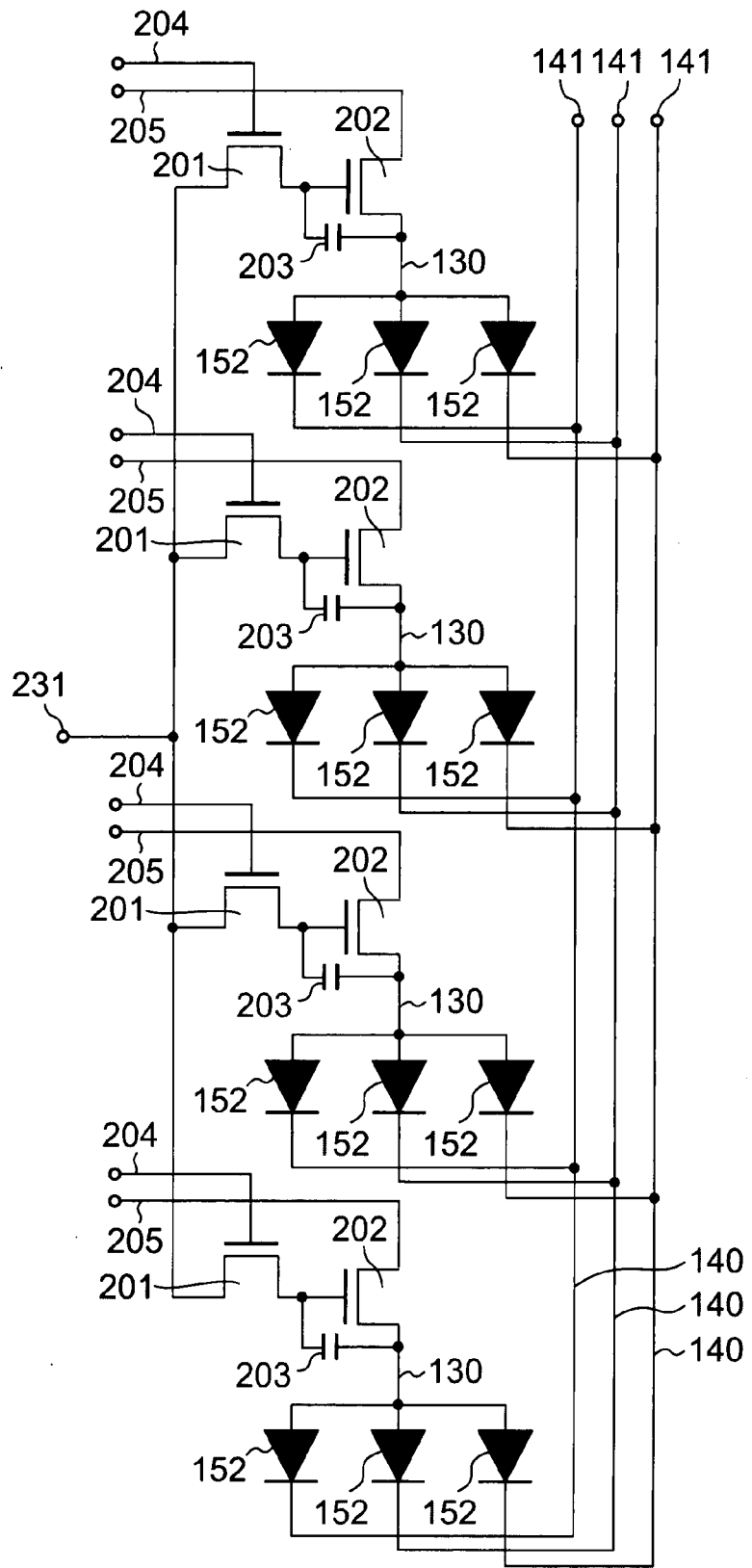
FIG. 25 is a view showing an equivalent circuit from a wiring line 231 to a leader wiring line 141 shown in FIG. 23.

FIG. 23 is a plan view of an exposure panel 120A mounted in the housing 114 (shown in FIG. 18) in place of the exposure panel 120 of the first embodiment. FIG. 24 is a sectional view of a surface cut along the line VII-VII of FIG. 23. FIG. 25 is a view of an equivalent circuit for one wiring line 231.

In the exposure panel 120A, a plurality of data electrodes 130 are patterned on a substrate 121, the data electrodes 130 are covered with an insulating film 160, and a plurality of selected electrodes 140 are patterned on the insulating film 160. When seen from a plane, the data electrodes 130 and the selected electrodes 140 are perpendicular to each other, an opening 161 is formed at each intersection between the data electrode 130 and the selected electrode 140, an EL layer 150 is buried in each opening 161 to be held between the data electrode 130 and the selected electrode 140. In addition to the data electrode 130, the selected electrode 140, the EL layer 150, the insulating film 160, and the opening 161, a residual layer 151, a sealant 170, and a sealing plate 180 are disposed as in the case of the first embodiment.

According to this embodiment, however, the data electrode 130 is not exposed from the insulating film 160. Further, an end of the data electrode 130 is not a terminal for a LSI chip 113. Differences of the exposure panel 120A from the exposure panel 120 of the first embodiment will be described.

In the exposure panel 120A for an exposure device of active driving, one lighting circuit is disposed for each data electrode 130. As shown in FIG. 25, the lighting circuit includes n channel type TFT's 201 and 202, and a capacitor 203. A gate of the TFT 201 is connected to a scanning line 204, a drain is connected to a wiring line 231, and a source is connected to a gate of the TFT 202. A drain of the TFT 202 is connected to a power supply line 205, and a source is connected to the data electrode 130. One end of the capacitor 203 is connected to the gate of the TFT 202, and the other end is connected to the source of the TFT 202. Each wiring line 231 corresponds to four lighting circuits, and branched into four to be connected to the drain of the TFT 201 of the lighting circuit.

In each lighting circuit, the source of the TFT 202 is connected in parallel to three organic EL elements 152 disposed in one data electrode 130. Cathodes of the three organic EL elements 152 of each row are connected to selected electrodes 140 of columns.

The scanning line 204 is formed by patterning gate metals of the TFT's 201 and 202, and the power supply line 205 is formed by patterning source and drain metals of the TFT's 201 and 202. The scanning line 204 and the power supply line 205 are parallel to the selected electrode 140. A terminal 204a is disposed in an end of the scanning line 204, a terminal 205a is disposed in an end of the power supply line 205, and these terminals 204a and 205a are arrayed in a row along an edge of the substrate 121.

Figure 26:
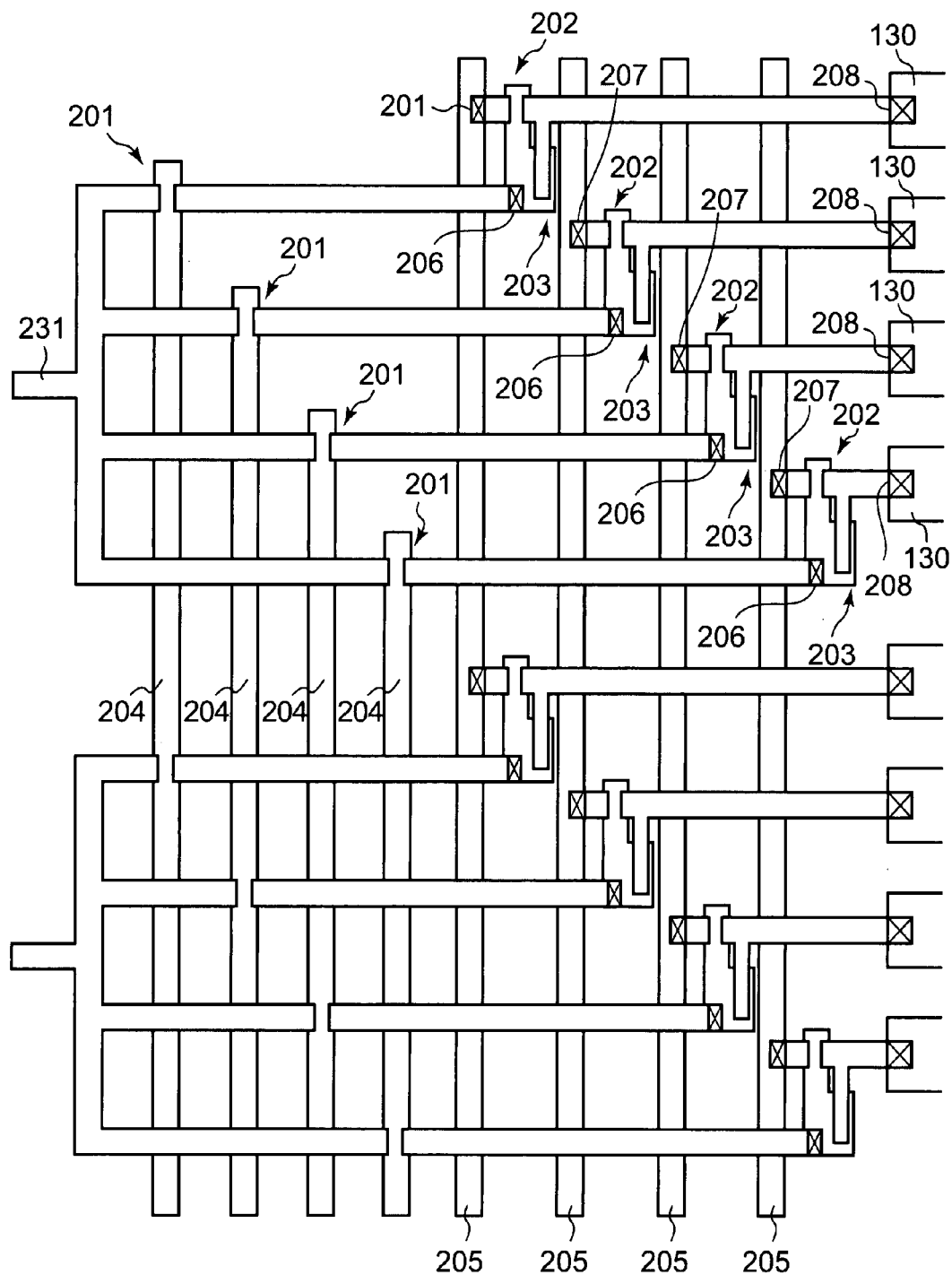
FIG. 26 is a plan view showing a portion between the wiring line 231 and an end of a data electrode 130 shown in FIG. 23.

FIG. 26 is a plan view of two wiring lines 231 and shows a portion between the wiring line 231 and the end of the data electrode 130. Each of the TFT's 201 and 202 is a reverse stagger type TFT which includes a gate on the substrate 121, a gate insulating film to cover the gate, a semiconductor film facing the gate on the gate insulating film, impurity semiconductor films formed in both sides of the semiconductor film, a source formed on one impurity semiconductor film, a drain formed on the other impurity semiconductor film, and the like. In FIG. 26, to simplify the drawing, the impurity semiconductor, the semiconductor and the impurity semiconductor film interposed between the source and the drain on the gate insulating film are omitted.

The gates, the scanning lines 204 and the power supply lines 205 of the TFT's 201 and 202 are formed on the substrate 121 to be covered with the gate insulating films. The sources and the drains of the TFT's 201 and 202 are covered with the insulating film 160, and further covered with the sealant 170.

The gate of the TFT 201 is formed integrally with the scanning line 204. One of the source and the drain of the substrate 121 is formed integrally with the wiring line 231, and the other is connected to the gate of the TFT 202 via a contact hole 206. The contact hole 206 is formed in the gate insulating film.

The gate of the TFT 202 is integral with one electrode of the capacitor 203. One of the source and the drain of the TFT 202 is connected to the power supply line 205 via a contact hole 207, and the other is integral with the other electrode of the capacitor 203, and connected to the data electrode 130 via the contact hole 208. The capacitor includes a gate insulating film between one electrode and the other electrode.

Figure 27:
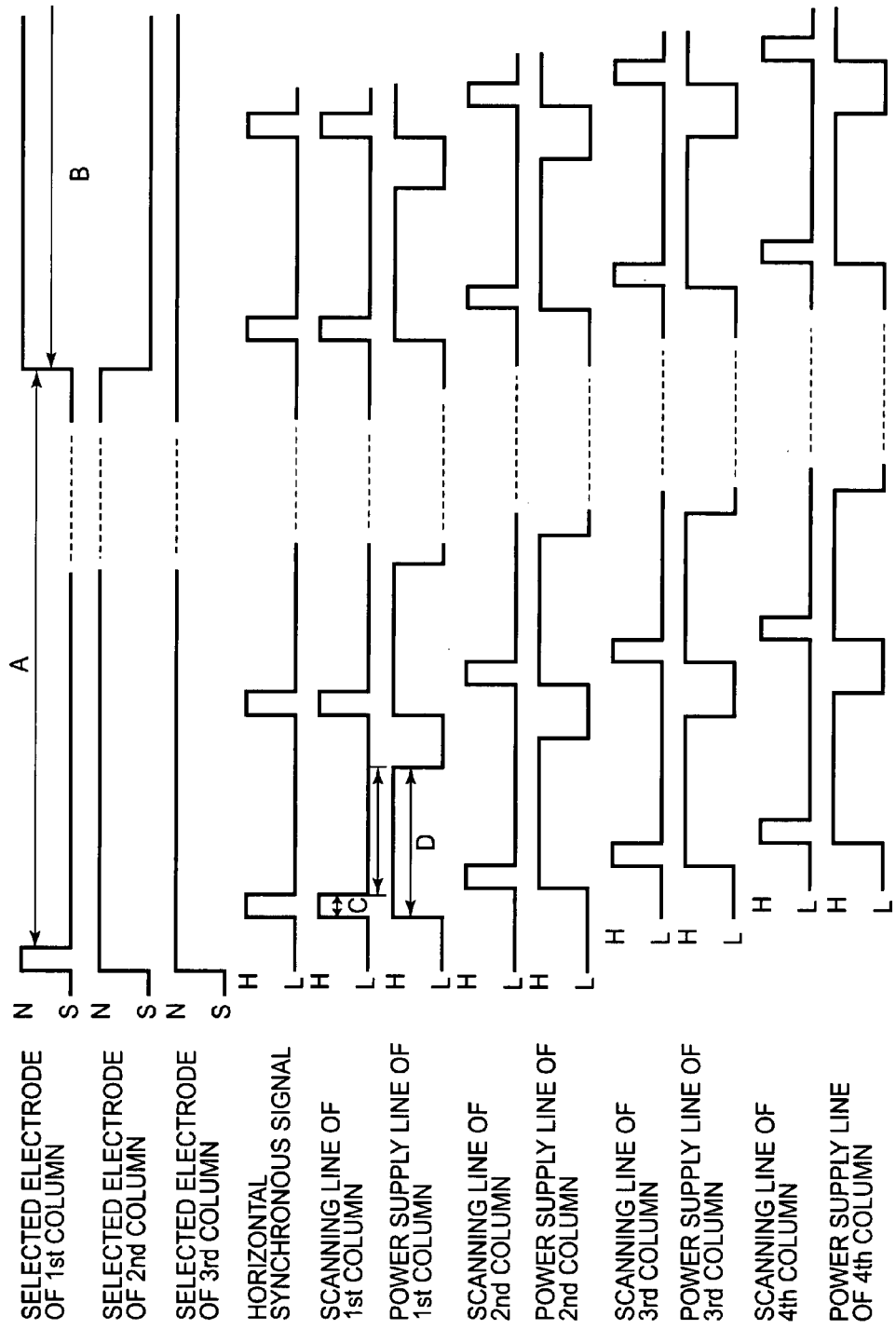
FIG. 27 is a timing chart of voltages applied to a selected electrode, a scanning line, and a power supply line.

Next, referring to FIG. 27, an operation method of the exposure panel 120A will be described.

One of the plurality of selected electrodes 140 is designated by a driving control circuit 115. A photosensitive drum 102, a charge roller 103, a develop roller 106, a transfer roller 107, and fixing rollers 108 and 109 are rotated, an erasure light source 111 emits a light, and paper 199 is conveyed on a conveyor belt 112. For example, if the selected electrodes 140 are cathodes, as shown in FIG. 27, in a designated period A in which a selected electrode of a 1st column is designated, a voltage of the selected electrode 140 is a selected voltage S (low level).

When one of the selected electrodes 140 is designated, a plurality of scanning lines 204 are sequentially selected (in order from the 1st column in FIG. 27) in synchronization with a horizontal synchronous signal (HYSYNC). After selection of a last scanning line 204 (4th column in FIG. 27), the first scanning line 204 (1st column in FIG. 27) is selected again, and sequential selection of the plurality of scanning lines 204 is repeated. In FIG. 27, one selection period of scanning lines 204 is indicated by C. If the selected electrodes 140 are cathodes, an on-level high voltage H is applied to the selected scanning line 204, while off-level low voltages L are applied to unselected scanning lines 204. In the selection period C, light emitting signals are output from the wiring line 231 to the selected and unselected scanning lines 204. However, only the TFT 201 connected to the selected scanning line 204 outputs a light emitting signal voltage to the gate of the TFT 202.

A plurality of power supply lines 205 are sequentially selected (in order from the 1st column in FIG. 27) in synchronization with the sequential selection of the plurality of scanning lines 204. After a last power supply line (4th column in FIG. 27) 205 is selected, the first power supply line (1st column in FIG. 27) is selected again, and sequential selection of the plurality of power supply lines 205 is repeated. A selection period D of the power supply lines 205 is longer than the selection period C of the scanning lines 204. When one of the scanning lines 204 is selected, a voltage of a power supply line 205 related to the scanning line 204 is set to a high level exceeding a threshold value of the TFT 202. Before next selection of this scanning line 204, the voltage of power supply line 205 related to the scanning line 204 is set to a low level less than the threshold value of the TFT 202. Accordingly, by a light emitting signal from each wiring line 231, only one organic EL element 152 of the four lighting circuits connected to the wring lines emits a light. In other words, in the selection period C of the scanning line of the 1st column, the TFT's 201 of 1st, 5th, . . . (4k−3)-th rows (k is an integer of 1 or more) are selected, high-level voltages H of the power supply line of the 1st column are applied to drains of the TFT's 202 of the 1st, 5th, . . . (4k−3) rows (k is an integer of 1 or more), and the organic EL element 152 emits a light according to a light emitting signal.

Thus, when one of the scanning lines 204 is selected (selection period C), the TFT 201 connected thereto is turned ON. When one of the scanning lines 204 is selected, gradation data (gradation data indicated by a size of a voltage) is output to the wiring line 231, the gradation data is held as charges in the capacitor 203 related to the turned-ON TFT 201, and the gradation data is output to the gate of the TFT 202 related to the turned-ON TFT 201. Accordingly, a current of a size according to the gradation data flows between the source and the drain of the TFT 202. Thus current also flows through the EL layer 150 disposed near a point of intersection between the designated selected electrode 140 and the data electrode 130. Thus, the organic EL element 152 emits a light. Upon an end of selection of the scanning line 204, the TFT 201 connected to the scanning line 204 is turned OFF to hold the data in the capacitor 203. In this case, as the power supply line 205 still maintains the high-level voltage H, the organic EL element 152 continues to emit a light. In the selection period D, the organic EL element 152 disposed near the point of intersection between the designated selected electrode 140 and the data electrode 130 emits a light.

In the period from the selection of the first scanning line 204 to the selection of the last scanning line 204, all the EL layers 150 below the designated selected electrode 140 emit lights once, forming images of one line on the paper 199. The sequential selection of the plurality of scanning lines 204 is repeated while the paper 199 is conveyed, a 2-dimensional image of one paper 199 is formed. In the case of forming images in a plurality of pieces of paper 199, the pieces of paper 199 are sequentially conveyed on the conveyor belt 112, and the exposure panel 120A is similarly operated.

Timing of switching the designated selected electrode 140 is similar to one of the first to sixth operation methods of the third embodiment.

The present invention is not limited to the aforementioned embodiments. Various improvements and design changes can be made without departing from the gist and scope of the invention.

According to embodiments, the electrostatic latent image is formed in the photosensitive drum 102 by the exposure panels 120 and 120A. For example, however, a latent image may be formed in a photosensitive film by the exposure panels 120 and 120A. When the photosensitive film having the latent image formed thereon is chemically or thermally developed, the image is made visible. For example, each embodiment shows the example of using the organic EL element as the light emitting element. However, a light emitting element such as a LED can be used.

Figure 28:
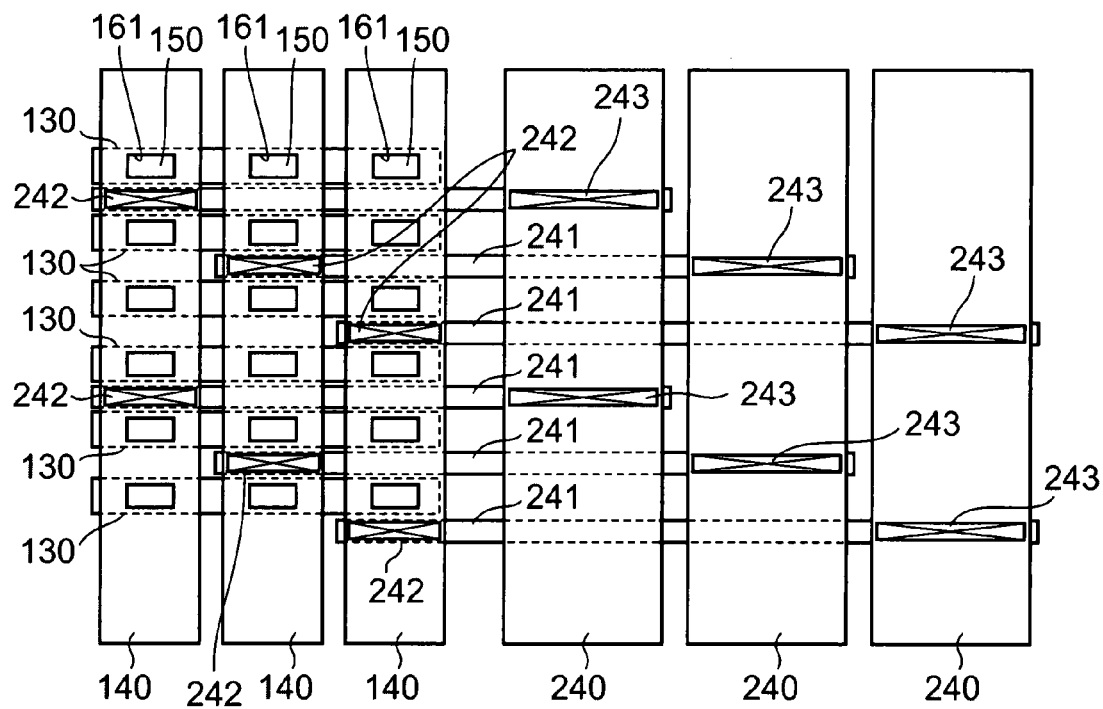
FIG. 28 is a plan view showing a modified example of each of the exposure panels of the third and fourth embodiments.

As shown in a plan view of FIG. 28, a plurality of bypass lines 240 may be formed on the insulating film 160. The bypass lines 240 are disposed in parallel to the selected electrodes 140, and the number of bypass lines 240 is equal to that of selected electrodes 140. Below the insulating film 160, a plurality of connection lines 241 parallel to the data electrodes 130 are formed. One end of the connection line 241 is connected to the selected electrode 140 via a contact hole 242, and the other end of the connection line 241 is connected to the selected electrode 140 via a contact hole 243. Accordingly, one bypass line 240 is conductive to one selected electrode 140. Because the bypass line 240 is conductive to the selected electrode 140, even if a width of the selected electrode 140 is small and resistance of the selected electrode 140 is high, the bypass line 240 assists conduction of the selected electrode 140. Thus, a width of the selected electrode 140 can be set small, and more selected electrodes 140 can be patterned in a narrow area. When the number of selected electrodes 140 increases, lives of the exposure panels 120 and 120A can be prolonged. Because the width of the selected electrode 140 is small, a plurality of selected electrodes 140 can be formed in a narrower area, and light transmission efficiency of the EL layer 150 by the imaging optical system 104 can be made uniform in any one of the selected electrodes 140. The bypass line 240 can be used for both of the exposure panel 120 of the third embodiment and the exposure panel 120A of the fourth embodiment.

As described above, during the image forming executed on the recording medium, one selected electrode of a predetermined column is designated among the plurality of selected electrodes, the selected electrodes of the other columns are undesignated, and the image forming is carried out on the recording medium only by the EL element of the column connected to the designated selected electrode. Thus, there is no deterioration due to light emission because the EL elements of the columns connected to the undesignated selected columns emit no lights. By predetermined timing, the designation of the selected electrode is switched to the selected electrode of another column. Thus, a reduction of emission luminance of the EL element can be suppressed, and long-time exposure can be performed.

Even if a failure occurs in the EL element, exposure can be carried out by not designating the selected electrode connected to the failed EL element but the selected electrode of another column. A yield ratio can be increased.

The entire disclosure of Japanese Patent Application No. 2006-263128, filed on Sep. 27, 2006, and Japanese Patent Application No. 2007-87376, filed on Mar. 29, 2007, including specifications, claims, drawings and summaries are incorporated herein by reference in their entirety.

Various typical embodiments have been described. However, the present invention is not limited to the embodiments. Thus, a scope of the invention is limited only by claims.

What is claimed is:

1. An exposure device for exposing a photoreceptor, comprising:
    a plurality of data electrodes disposed for each of a plurality of columns parallel to a moving direction of the photoreceptor;
    a plurality of selected electrodes disposed for each of a plurality of rows perpendicular to each of the data electrodes;
    a plurality of light emitting element arrays which include a plurality of light emitting elements disposed near intersection points between the data electrodes and the selected electrodes in intersections between the data electrodes and the selected electrodes, the plurality of light emitting elements being linearly arrayed;
    a driving signal output circuit for generating a driving signal based on an image signal to supply the driving signal to the light emitting element arrays; and
    a column selection unit for switching the light emitting element arrays to be selected based on a lighting situation of each of the light emitting elements of each of the light emitting element arrays.

2. The exposure device according to claim 1,
    wherein the driving signal output circuit time-sequentially supplies the driving signals corresponding to each of the predetermined number of light emitting elements of the light emitting element array, and
    wherein the exposure device further comprises:
        a dividing circuit for dividing each driving signal so as to correspond to the predetermined number of light emitting elements of the light emitting element array; and
        a division control circuit for controlling application of the driving signals to each of the predetermined number of light emitting elements according to time-sequential timing of the driving signal.

3. An exposure device for exposing a photoreceptor, comprising:
    a plurality of data electrodes disposed for each of a plurality of columns parallel to a moving direction of the photoreceptor;
    a plurality of selected electrodes disposed for each of a plurality of rows perpendicular to each of the data electrodes;
    a plurality of light emitting element arrays which include a plurality of light emitting elements disposed near intersection points between the data electrodes and the selected electrodes in intersections between the data electrodes and the selected electrodes, the plurality of light emitting elements being linearly arrayed; and
    a column selection unit for designating a selected electrode of a certain predetermined column among the plurality of selected electrodes and setting selected electrodes of the other columns to undesignated selected electrodes during image forming executed on a recording medium, for executing the image forming on the recording medium only by a light emitting element of a column connected to the designated selected electrode, and for switching the light emitting element arrays to be selected based on a lighting situation of each of the light emitting elements of each of the light emitting element arrays.

4. The exposure device according to claim 3, wherein the column selection unit switches the designating of the selected electrode to the selected electrode of another column every time the image forming executed on one recording medium is ended.

5. The exposure device according to claim 3, wherein the column selection unit switches the designating of the selected electrode to the selected electrode of another column every time the image forming executed on a plurality of recording media is ended.

6. The exposure device according to claim 3, wherein the column selection unit switches the designating of the selected electrode to the selected electrode of another column every time the image forming executed on a predetermined number of recording media within a predetermined period is ended.

7. The exposure device according to claim 3, wherein the column selection unit switches the designating of the selected electrode to the selected electrode of another column when a light emitting element corresponding to the designated selected electrode reaches a predetermined temperature.

8. The exposure device according to claim 3, wherein the column selection unit switches the designating of the selected electrode to the selected electrode of another column when an applied current flowing through the light emitting element is reduced to a predetermined value due to time degradation of the light emitting element.

9. The exposure device according to claim 3, wherein the column selection unit switches the designating of the selected electrode to the selected electrode of another column when a voltage applied to the light emitting element increases to a predetermined value due to time degradation of the light emitting element.

10. The exposure device according to claim 3, wherein the column selection unit switches the designating of the selected electrode to the selected electrode of another column every time an image forming apparatus is started up.

11. The exposure device according to claim 3, wherein a lighting circuit of the light emitting element arrays includes a plurality of transistors connected to the data electrodes.

12. A method for operating an exposure device which exposes a photoreceptor, the exposure device including a plurality of data electrodes disposed for each of a plurality of columns parallel to a moving direction of the photoreceptor; a plurality of selected electrodes disposed for each of a plurality of rows perpendicular to each of the data electrodes; and a plurality of light emitting element arrays which include a plurality of light emitting elements disposed near intersection points between the data electrodes and the selected electrodes in intersections between the data electrodes and the selected electrodes, the plurality of light emitting elements being linearly arrayed; wherein the method comprises:

designating a selected electrode of a certain predetermined column among the plurality of selected electrodes and setting selected electrodes of the other columns to undesignated selected electrodes during image forming executed on a recording medium;

executing the image forming on the recording medium only by a light emitting element of a column connected to the designated selective electrode; and switching the light emitting element arrays to be selected based on a lighting situation of each of the light emitting elements of each of the light emitting element arrays.

13. The method according to claim 12, wherein the switching of the light emitting element arrays to be selected comprises switching the designating of the selected electrode to the selected electrode of another column every time the image forming executed on one recording medium is ended.

14. The method according to claim 12, wherein the switching of the light emitting element arrays to be selected comprises switching the designating of the selected electrode to the selected electrode of another column every time the image forming executed on a plurality of recording media is ended.

15. The method according to claim 12, wherein the switching of the light emitting element arrays to be selected comprises switching the designating of the selected electrode to the selected electrode of another column every time the image forming executed on a predetermined number of recording media within a predetermined period is ended.

16. The method according to claim 12, wherein the switching of the light emitting element arrays to be selected comprises switching the designating of the selected electrode to the selected electrode of another column when a light emitting element superposed in the designated selected electrode reaches a predetermined temperature.

17. The method according to claim 12, wherein the switching of the light emitting element arrays to be selected comprises switching the designating of the selected electrode to the selected electrode of another column when an applied current flowing through the light emitting element is reduced to a predetermined value due to time degradation of the light emitting element.

18. The method according to claim 12, wherein the switching of the light emitting element arrays to be selected comprises switching the designating of the selected electrode to the selected electrode of another column when a voltage applied to the light emitting element increases to a predetermined value due to time degradation of the light emitting element.

19. The method according to claim 12, wherein the switching of the light emitting element arrays to be selected comprises switching the designating of the selected electrode to the selected electrode of another column every time an image forming apparatus is started up.

20. An exposure device for exposing a photoreceptor, comprising:

a light emission unit including a plurality of light emitting element arrays which comprise a plurality of light emitting elements which are linearly arrayed, and a plurality of first switching elements disposed so as to correspond to the plurality of light emitting elements, respectively, the light emission unit having a structure in which the light emitting element arrays are arranged in parallel;

a driving signal output circuit for generating a driving signal based on an image signal to supply the driving signal to the light emission unit;

a column selection unit for controlling turning ON/OFF of the plurality of first switching elements for each light emitting element array to select the light emitting element array to which the driving signal is applied via the first switching elements so as to correspond to each of predetermined number of light emitting elements, among the plurality of light emitting element arrays;

a dividing circuit including a circuit for dividing each of the driving signals supplied from the driving signal output circuit so as to correspond to the predetermined number of light emitting elements of the light emitting element array, and a plurality of second switching elements disposed so as to correspond to each of the divided driving signals to interrupt application of the divided driving signals to each of the predetermined number of light emitting elements; and a division control circuit for controlling turning ON/OFF of the second switching elements by timings which are different from one another, to control the application of the divided driving signals to each of the predetermined number of light emitting elements.

21. The exposure device according to claim 20, wherein the column selection unit switches the light emitting element array to be selected based on a lighting situation of each of the light emitting elements of each of the light emitting element arrays.

22. An image forming apparatus for forming an image on a recording medium, comprising:

a photosensitive drum including a photoreceptor; and an exposure device for irradiating the photoreceptor of the photosensitive drum with a light based on an image signal to expose the photoreceptor, and for executing printing on the recording medium according to the image signal, wherein the exposure device comprises:

a light emission unit including a plurality of light emitting element arrays which comprise a plurality of light emitting elements which are linearly arrayed, and a plurality of first switching elements disposed so as to correspond to the plurality of light emitting elements, respectively, the light emission unit having a structure in which the light emitting element arrays are arranged in parallel;

a driving signal output circuit for generating a driving signal based on an image signal to supply the driving signal to the light emission unit;

a column selection unit for controlling turning ON/OFF of the plurality of first switching elements for each light emitting element array to select the light emitting element array in which the driving signal is applied to each of the light emitting elements via the first switching elements, among the plurality of light emitting element arrays of the light emission unit;

a dividing circuit including a circuit for dividing each of the driving signals supplied from the driving signal output circuit so as to correspond to the predetermined number of light emitting elements of the light emitting element array, and a plurality of second switching elements disposed so as to correspond to each of the divided driving signals to interrupt application of the divided driving signals to each of the predetermined number of light emitting elements; and a division control circuit for controlling turning ON/OFF of the second switching elements by timings which are different from one another, to control the application of the divided driving signals to each of the predetermined number of light emitting elements.

23. The image forming apparatus according to claim 22, wherein the column selection unit switches the light emitting element array to be selected based on a predetermined condition according to a lighting situation of the plurality of light emitting elements of each of the light emitting element arrays.

* * * * *